US011374030B2

(12) United States Patent
Zhang

(10) Patent No.: US 11,374,030 B2
(45) Date of Patent: Jun. 28, 2022

(54) ARRAY SUBSTRATE, MANUFACTURING METHOD THEREOF, DISPLAY PANEL AND DISPLAY DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventor: Zhen Zhang, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 442 days.

(21) Appl. No.: 16/471,671

(22) PCT Filed: Dec. 14, 2018

(86) PCT No.: PCT/CN2018/121271
§ 371 (c)(1),
(2) Date: Jun. 20, 2019

(87) PCT Pub. No.: WO2019/218659
PCT Pub. Date: Nov. 21, 2019

(65) Prior Publication Data
US 2021/0366933 A1 Nov. 25, 2021

(30) Foreign Application Priority Data
May 17, 2018 (CN) ......................... 201810473898.2

(51) Int. Cl.
*H01L 27/12* (2006.01)
*H01L 23/552* (2006.01)
(Continued)

(52) U.S. Cl.
CPC ........ *H01L 27/124* (2013.01); *G06V 40/1318* (2022.01); *H01L 23/552* (2013.01);
(Continued)

(58) Field of Classification Search
CPC ..... G06K 9/0004; H01L 23/552; H01L 25/18; H01L 27/124; H01L 27/1248; H01L 27/1262; H01L 27/3272
See application file for complete search history.

(56) References Cited

U.S. PATENT DOCUMENTS 7,208,766 B2 * 4/2007 Yamazaki ........... H01L 27/1237 257/72
8,368,676 B2 2/2013 Satoh et al.
(Continued)

FOREIGN PATENT DOCUMENTS

CN 105336751 A 2/2016
CN 107657231 A 2/2018
(Continued)

OTHER PUBLICATIONS

First Chinese Office Action from Chinese Patent Application No. 201810473898.2 dated Apr. 7, 2021.
(Continued)

*Primary Examiner* — Allan R Wilson
(74) *Attorney, Agent, or Firm* — Dilworth & Barrese, LLP.; Michael J. Musella, Esq.

(57) ABSTRACT

An array substrate, a manufacturing method thereof, a display panel and a display device are disclosed. The array substrate includes a base substrate, a light shielding layer, an active layer of a thin film transistor, and an insulating layer. The light shielding layer includes light transmission holes on the base substrate. The active layer of the thin film transistor is located on the side of the light shielding layer away from the base substrate. An insulating layer is located on the base
(Continued)

substrate. The insulating layer includes a first through hole in communication with the light transmission hole.

20 Claims, 14 Drawing Sheets

(51) Int. Cl.
*H01L 25/18* (2006.01)
*H01L 27/32* (2006.01)
*G06V 40/13* (2022.01)

(52) U.S. Cl.
CPC .......... *H01L 25/18* (2013.01); *H01L 27/1248* (2013.01); *H01L 27/1262* (2013.01); *H01L 27/3272* (2013.01)

(56) References Cited

U.S. PATENT DOCUMENTS

| | | | |
|---|---|---|---|
| 9,648,216 | B2 | 5/2017 | Yoo et al. |
| 10,503,947 | B2 | 12/2019 | Liu et al. |
| 10,627,550 | B2 | 4/2020 | Liu et al. |
| 10,867,155 | B2 | 12/2020 | Zhang et al. |
| 2016/0172376 | A1 | 6/2016 | Xu et al. |
| 2017/0162606 | A1* | 6/2017 | Yan .................. H01L 29/78648 |

FOREIGN PATENT DOCUMENTS

| | | | |
|---|---|---|---|
| CN | 107994034 | A | 5/2018 |
| KR | 1020060008680 | A | 1/2006 |
| KR | 20140125029 | A | 10/2014 |
| WO | 2018059060 | A1 | 4/2018 |

OTHER PUBLICATIONS

First Korean Office Action from Korean Patent Application No. 10-2020-7018736 dated Sep. 23, 2021.

First Indian Office Action from Indian Patent Application No. 201947033993 dated Oct. 1, 2021.

* cited by examiner

ARRAY SUBSTRATE, MANUFACTURING METHOD THEREOF, DISPLAY PANEL AND DISPLAY DEVICE

CROSS-REFERENCE TO RELATED APPLICATIONS

This patent application claims the priority of Chinese patent application No. 201810473898.2, entitled "array substrate and manufacturing method thereof, display panel and display device", filed on May 17, 2018, and the disclosure of the above-mentioned Chinese patent application is incorporated herein by reference in its entirety as part of the embodiment of this disclosure.

TECHNICAL FIELD

The embodiments of the disclosure relate to an array substrate, a manufacturing method thereof, a display panel and a display device.

BACKGROUND

With the rapid development of mobile payment and mobile information exchange, the demand for convenient and effective security technologies suitable for display devices is also increasing day by day. Fingerprint identification technology, palmprint identification technology and iris identification technology and other human biometric identification technologies are gradually adopted by mobile electronic devices.

If a separate imaging module is introduced to enable the display device to have human body biometric identification functions such as fingerprint identification or palm print identification, the volume, weight, cost and power consumption of the display device will be increased, which is contrary to the requirements and expectations of current consumers for electronic products, especially consumer electronic products.

The display device based on the in-screen fingerprint identification technology does not need to be provided with a separate fingerprint identification module, thus having the advantages of small size of the lower frame of the screen, easy realization of full screen, oil stain resistance, water stain resistance, dust resistance and the like. Due to the above advantages, the display device based on the in-screen fingerprint identification technology has attracted wide attention.

SUMMARY

At least an embodiment of the present disclosure provides an array substrate including: a base substrate; a light shielding layer, which is on the base substrate and comprises a light transmission hole; an active layer of a thin film transistor, located at one side of the light shielding layer away from the base substrate; and an insulating layer located on the base substrate, the insulating layer including a first through hole, and the first through hole being in communication with the light transmission hole.

In some embodiments of the present disclosure, the orthographic projection of the first through hole on the base substrate and the orthographic projection of the active layer on the base substrate do not overlap.

In some embodiments of the present disclosure, the orthogonal projection of the light transmission hole on the base substrate is completely within the orthogonal projection of the first through hole on the base substrate.

In some embodiments of the present disclosure, the array substrate further includes a filling structure filled in the first through hole and the light transmission hole.

In some embodiments of the present disclosure, the first through hole and the light transmitting hole are completely filled by the filling structure.

In some embodiments of the present disclosure, the array substrate further includes a filling layer located on a side of the insulating layer away from the base substrate, and the filling structure is integrally formed with the filling layer.

In some embodiments of the present disclosure, the fill layer includes any one of a group consisting of a passivation layer, a gate insulating layer, an interlayer insulating layer, and a planarization layer.

In some embodiments of the present disclosure, the insulating layer includes at least one of a group consisting of a buffer layer, a passivation layer, a gate insulating layer, and an interlayer insulating layer.

In some embodiments of the present disclosure, the array substrate further includes a source electrode and a drain electrode, and the source electrode and the drain electrode are respectively connected to the active layer through second through holes penetrating at least one of the passivation layer, the gate insulating layer, and the interlayer insulating layer.

In some embodiments of the present disclosure, the array substrate further includes a connection electrode connected to the light shielding layer through a third through hole penetrating at least one of the buffer layer, the passivation layer, the gate insulating layer, and the interlayer insulating layer.

In some embodiments of the present disclosure, the light transmission holes are located at least partially between pixels of the array substrate.

In some embodiments of the present disclosure, the array substrate further includes an imaging device formed on a side of the base substrate away from the light shielding layer, the imaging device and the light transmission hole at least partially overlapping in a direction perpendicular to the base substrate.

At least an embodiment of the present disclosure also provides a display panel including any of the above array substrates.

At least an embodiment of the present disclosure also provides a display device including any of the above array substrates or any of the above display panels.

At least an embodiment of the present disclosure also provides a manufacturing method of the array substrate, including: providing a base substrate; forming a light shielding film layer on the base substrate; forming an active layer of a thin film transistor on the light shielding thin film layer; and after the active layer is formed, pattering the light shielding film layer to form a light shielding layer. The light shielding layer comprises a light transmission hole.

In some embodiments of the present disclosure, the method further includes forming an insulating layer, patterning the insulating layer to form a first through hole therein, and patterning the light shielding thin film layer through the first through hole to form the light transmission hole, and the orthogonal projection of the first through hole on the base substrate and the orthogonal projection of the active layer on the base substrate do not overlap.

In some embodiments of the present disclosure, the method further includes forming a filling structure filled in the first through hole and the light transmission hole.

In some embodiments of the present disclosure, the filling structure completely fills the first through hole and the light transmitting hole.

In some embodiments of the present disclosure, the method further includes forming a filling layer on the insulating layer, wherein the filling structure is part of the filling layer.

In some embodiments of the present disclosure, the fill layer includes any one of a group consisting of a passivation layer, a gate insulating layer, an interlayer insulating layer, and a planarization layer.

In some embodiments of the present disclosure, forming the insulating layer includes forming at least one of a group consisting of a buffer film layer, a passivation film layer, a gate insulating film layer, and an interlayer insulating film layer.

In some embodiments of the present disclosure, the method further includes forming a connection electrode and forming a third through hole penetrating at least one of the buffer film layer, the passivation film layer, the gate insulating film layer, and the interlayer insulating film layer; and the connection electrode is connected to the light shielding layer through the third through hole.

In some embodiments of the present disclosure, the method further includes providing an imaging device on a side of the base substrate away from the light shielding layer, the imaging device at least partially overlapping the light transmission hole in a direction perpendicular to the base substrate.

BRIEF DESCRIPTION OF THE DRAWINGS

In order to more clearly explain the technical scheme of the embodiments of the present disclosure, the following will briefly introduce the drawings of the embodiments. Obviously, the drawings in the following description only refer to some embodiments of the present disclosure, and not to the limitations of the present disclosure.

DETAILED DESCRIPTION

In order to make objects, technical solutions and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1A:
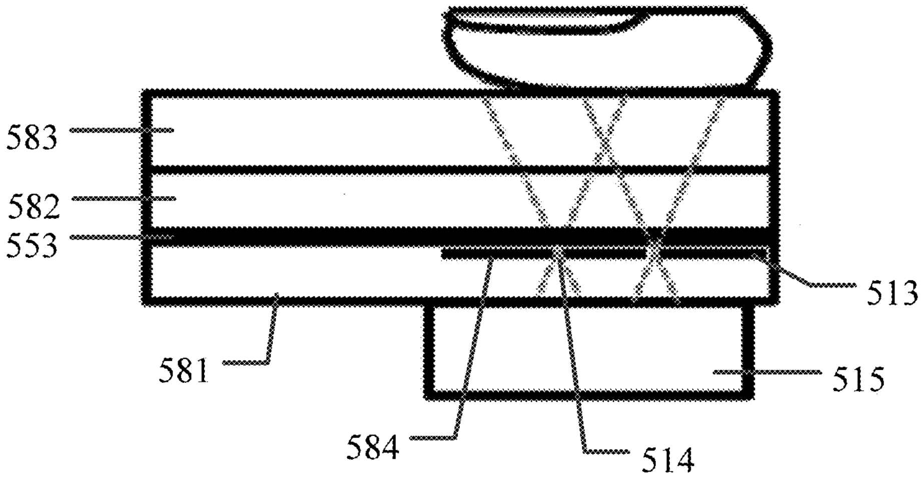
FIG. 1A is a display device having a fingerprint identification function.

FIG. 1A is a display device with on-screen fingerprint identification function. As illustrated in FIG. 1A, the display device includes a driving backplate 581, a light emitting layer 553, a laminated film layer 582, and a cover plate 583. For example, the light emitting layer 553 may include a plurality of light emitting units (not illustrated in the figure). For example, the driving backplate 581 may include a light shielding layer 513, thin film transistors 512 (see FIG. 1B), and an imaging device 515. The light shielding layer 513 may include a plurality of light transmitting regions (i.e., holes) and light shielding regions 584 for spacing the plurality of light transmitting regions. The thin film transistors 512 may be used in a display driving circuit to drive a plurality of light emitting units to emit light. The imaging device 515 may include a plurality of imaging pixels. For example, the cover plate 583 can be used to protect the related film layers of the display device from being scratched. The laminated film layer 582 may include a packaging layer or the like to alleviate oxidation problems caused by water vapor or oxygen in air. According to actual application requirements, the laminated film 582 may also include other film layers (e.g., electrode layers), which are not described in detail herein.

For example, light rays incident on the skin of a finger (e.g., light rays emitted by the light emitting units) will be diffusely reflected, and part of the diffusely reflected light rays returns to the display device and be incident on the imaging device 515 (see FIG. 2D) via the light transmitting region of the light shielding layer 513 (i.e., the holes 514 of the light shielding layer), whereby the imaging device 515 can image the fingerprint of the finger, and further the display device illustrated in FIG. 1A can realize the on-screen fingerprint identification function.

Figure 1B:
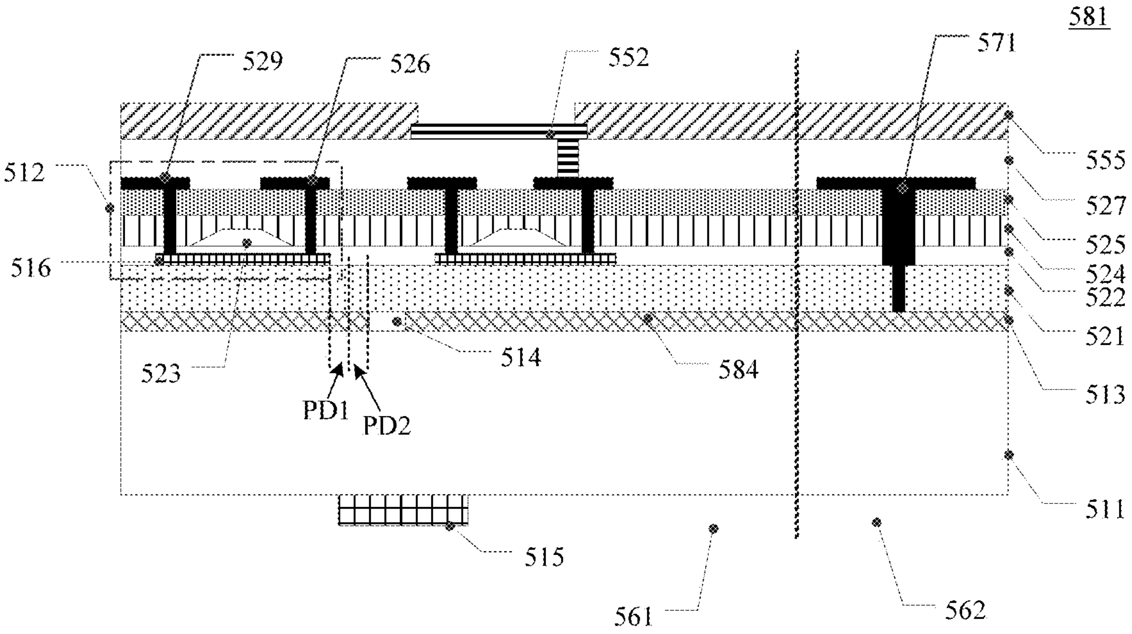
FIG. 1B is an exemplary structural diagram of the drive backplate illustrated in FIG. 1A.

FIG. 1B is an exemplary structural diagram of the drive backplate 581 illustrated in FIG. 1A. As illustrated in FIG. 1B, the driving backplate 581 includes a base substrate 511, a light shielding layer 513, a buffer layer 521, an active layer 516 of a thin film transistor 512, a gate insulating layer 522 of the thin film transistor 512, a gate electrode 523 of the thin film transistor 512, a passivation layer 524 of the thin film transistor 512, an interlayer insulating layer 525, a source electrode 529 and a drain electrode 5 of the thin film transistor 512, a planarization layer 527, a first electrode 552, and a pixel defining layer 555. For example, the light shielding layer 513 includes a light shielding region 584 that may include a plurality of light transmitting regions (i.e., a plurality of holes 514) and is used to space the plurality of light transmitting regions. For example, the light shielding layer 513 may be made of metal, but according to actual application requirements, the light shielding layer 513 may also be made of other materials having a light shielding function.

The inventors have noted that for the current manufacturing process of the driving backplate 581, in order to ensure the performance of the thin film transistor 512, a large spacing needs to be reserved between the orthogonal projection of the active layer 516 of the thin film transistor 512 on the light shielding layer 513 and the light transmission regions (i.e., the holes 514 of the light shielding layer) of the adjacent light shielding layer 513. Based on a given resolution, this makes the diameter of the light transmission region (i.e., the hole of the light shielding layer) of the light shielding layer 513 smaller. Thus, the intensity of diffuse reflection light, which is from a finger and incident on the imaging device 515, is made small, thereby making the imaging quality of the imaging device 515 poor (e.g., the signal-to-noise ratio of the image output by the imaging device 515 is small).

The inventors also noted that in order to avoid parasitic capacitance caused by floating of the light shielding layer 513 and warping effect of the thin film transistor 512, the light shielding layer 513 can be electrically connected through the connection electrode 571 electrically connected to the light shielding layer 513 to release the electric charge accumulated on the light shielding layer 513. However, the inventors have noted that in order to form the connection electrode 571, at least one additional patterning process is required. Considering that at least one additional patterning process is required in order to form the hole 514 of the light shielding layer, at least two additional patterning processes are required in order to manufacture the driving backplate 581 and the display device with the on-screen fingerprint identification function, which will greatly reduce the manufacturing efficiency of the driving backplate 581 and the display device and increase the required manufacturing cost.

Next, a method for solving at least one of the above problems will be exemplarily described with reference to FIG. 2A to FIG. 2D. For example, FIG. 2A to FIG. 2D show a manufacturing method of a driving backplate 581. For example, as illustrated in FIG. 2A to FIG. 2D, the manufacturing method of the driving backplate 581 may include the following steps.

Figure 2A:
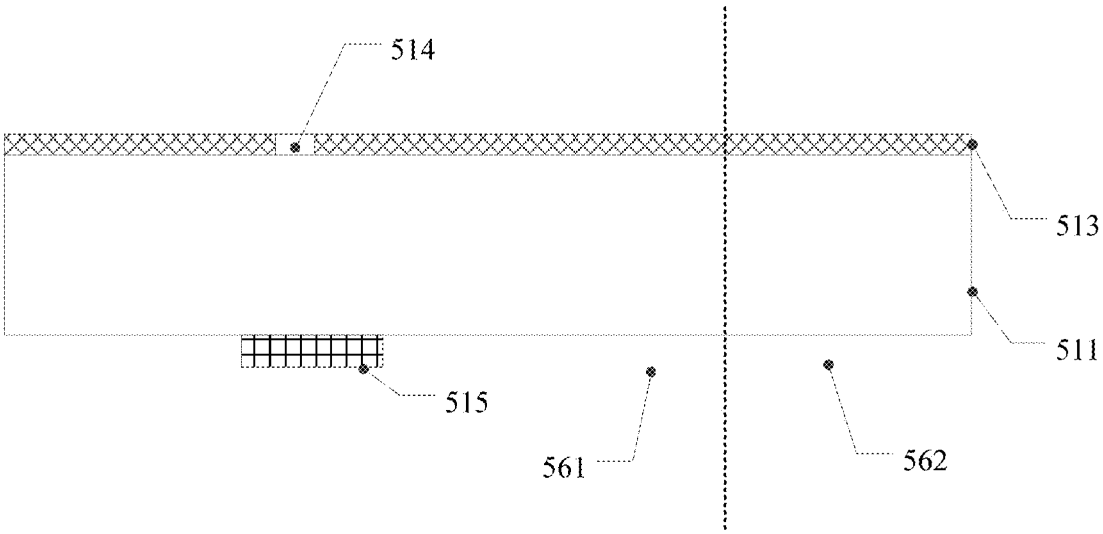
FIG. 2A to FIG. 2E are schematic diagrams of a manufacturing method of a driving backplate.

Step S511: a base substrate 511 is provided (see FIG. 2A). In order to facilitate explanation of the positions of various structures formed subsequently, the imaging device 515 is illustrated in FIG. 2A, but the imaging device 515 may be arranged subsequently.

Step S512: a light shielding layer 513 of a metal material (e.g., metal Mo) is formed on the base substrate 511, and the light shielding layer 513 is patterned to form a hole 514 (see FIG. 2A).

Figure 2B:
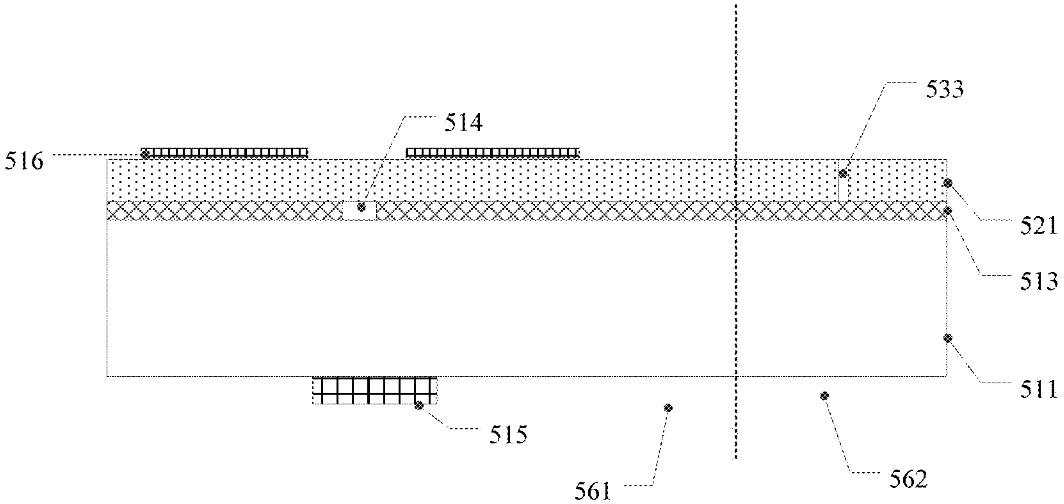

Step S513: a buffer layer 521 made of an insulating material is formed on the light shielding layer 513, and an active layer 516 of the thin film transistor 512 is formed on the buffer layer 521 (see FIG. 2B).

Step S514: the buffer layer 521 is patterned to form a third via hole 533 (see FIG. 2B) to expose the light shielding layer 513.

Figure 2C:
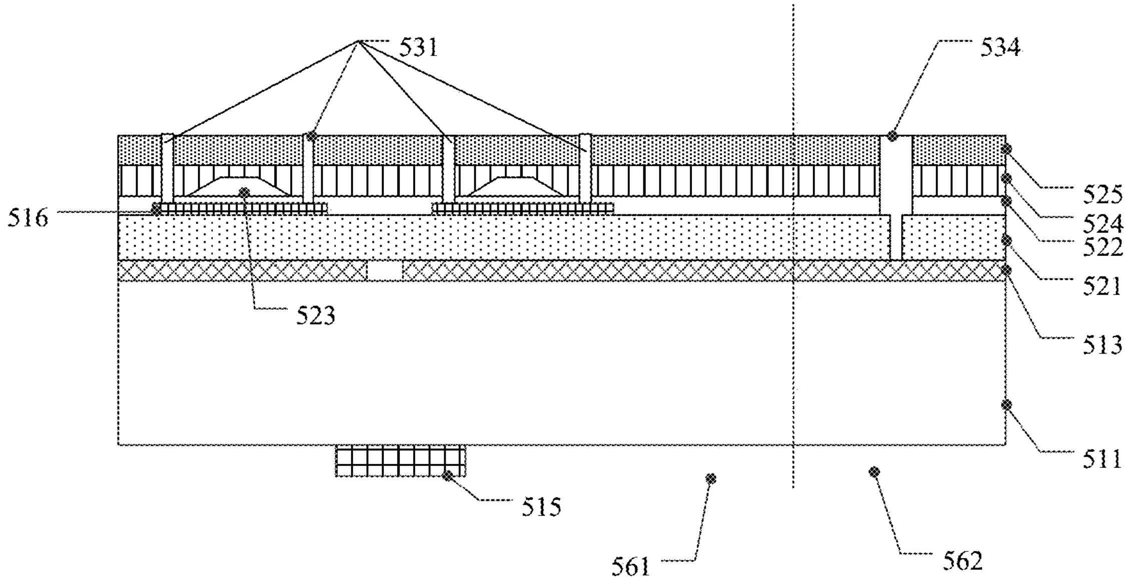

Step S515: a gate insulating layer 522 of the thin film transistor 512, a gate electrode 523 of the thin film transistor 512, a passivation layer 524 of the thin film transistor 512, and an interlayer insulating layer 525 are sequentially formed on the active layer 516 of the thin film transistor 512 (see FIG. 2C).

Step S516: the gate insulating layer 522 of the thin film transistor 512, the passivation layer 524 of the thin film transistor 512, and the interlayer insulating layer 525 are patterned to form second via holes 531 and a fourth via hole 534 (see FIG. 2C).

Figure 2D:
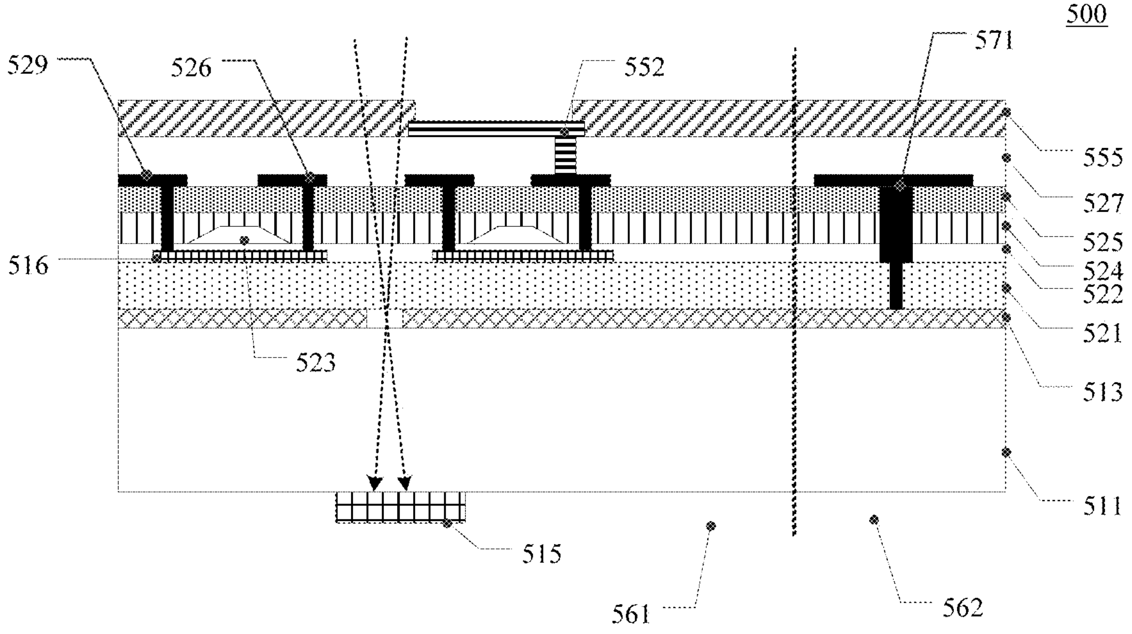

Step S517: a source electrode 529 and a drain electrode 5 contacting the active layer 516 through the second via holes 531 are formed in the display region 561, and a connection electrode 571 contacting the light shielding layer 513 through the third via hole 533 and the fourth via hole 534 is formed in the peripheral region 562 (see FIG. 2D).

Step S518: a planarization layer 527, a first electrode 552, and a pixel defining layer 555 are formed on the source electrode 529, the drain electrode 5 and the connection electrode 571, and the first electrode 552 is connected to the source or drain through a via hole in the planarization layer 527 (see FIG. 2D).

For example, in step S513, forming the active layer 516 of the thin film transistor 512 on the buffer layer 521 includes forming an amorphous silicon layer on the buffer layer 521 and performing an annealing process on the amorphous silicon layer to convert the amorphous silicon layer into a polysilicon layer. For example, performing an annealing process on the amorphous silicon layer includes irradiating the amorphous silicon layer with laser light (e.g., laser light output from an excimer laser), the amorphous silicon layer absorbs the laser light and generates heat, and gradually changes from a surface melting state to a completely melting state, and the amorphous silicon layer changes into a polysilicon layer in the cooling process.

Figure 2E:
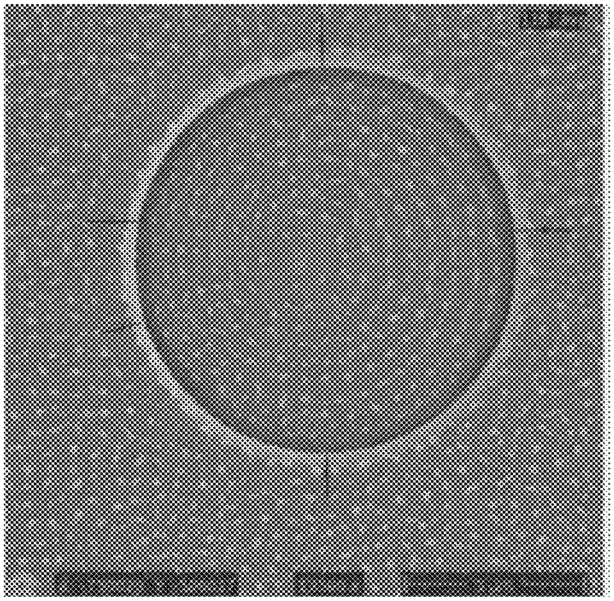

The inventors have noted that because there are a plurality of holes in the light shielding layer 513, during laser irradiation of the amorphous silicon layer, there is a temperature difference (e.g., a temperature gradient) between the region of the light shielding layer 513 close to the hole 514 of the light shielding layer and the region away from the hole 514 of the light shielding layer, and thus the grain morphology of the region of the polysilicon layer close to the hole 514 of the light shielding layer (e.g., the region where the distance between the orthogonal projection on the light shielding layer 513 and the hole 514 of the light shielding layer is less than, for example, 1 micron) is adversely affected, thereby deteriorating the performance of the thin film transistor 512. FIG. 2E shows a Scanning Electron Microscope (SEM) photograph of a polycrystalline silicon layer that is obtained by crystallizing an amorphous silicon layer and covers a hole in a light shielding layer, and it can be seen that polycrystalline silicon grains corresponding to the inside of the hole (circular part in the photograph) and the edge part of the hole are affected differently from other parts.

Therefore, in order to ensure the performance of the thin film transistor 512, the orthogonal projection of the active layer 516 of the thin film transistor 512 on the light shielding layer 513 is between the light transmitting regions of the adjacent light shielding layer 513. The pitch PD that needs to be reserved needs to include not only the first predetermined pitch PD1 (e.g., 0.6 microns) corresponding to the process accuracy error, but also the second predetermined pitch PD2 (e.g., 1 micron or 2 microns) corresponding to the annealing temperature difference (e.g., temperature gradient). Because the additional second predetermined pitch PD2 makes the diameter of the light transmitting region of the light shielding layer 513 smaller (e.g., 6.5 microns or 5.5 microns), the intensity of the diffuse reflection light that is from a finger and incident on the imaging device 515 is reduced, thereby reducing the signal-to-noise ratio of the image output by the imaging device 515.

In addition, because the patterning of the light shielding layer 513 and the patterning of the buffer layer 521 are two separate processes, and at least one additional patterning process is required to form the hole 514 of the light shielding layer, at least two additional patterning processes are required to manufacture the driving backplate 581 and the display device with the on-screen fingerprint identification function. However, in order to manufacture the driving backplate 581 and the display device with the on-screen fingerprint identification function and the suppressed warping effect of the thin film transistor, at least three additional patterning processes are required, which will greatly reduce the manufacturing efficiency of the driving backplate 581 and the display device and increase the required manufacturing costs.

For example, in FIG. 1B, FIG. 2B, FIG. 2C and FIG. 2D, the holes 514 in the light shielding layer may also be filled with the material of the buffer layer 521.

The embodiments of the disclosure provide an array substrate, a manufacturing method thereof, a display panel and a display device. The array substrate, the manufacturing method thereof, the display panel and the display device can improve the imaging quality.

At least an embodiment of the present disclosure provides that the array substrate includes a base substrate, a light shielding layer, an active layer of a thin film transistor, and an insulating layer. The light shielding layer is on the base substrate and comprises light transmission holes. The active layer of the thin film transistor is located on the side of the light shielding layer away from the base substrate. An insulating layer is located on the base substrate. The insulating layer comprises a first through hole, and the first through hole is communicated with the light transmission hole.

At least an embodiment of the present disclosure provides an array substrate including a base substrate, a light shielding layer, and a thin film transistor. The light shielding layer is arranged between the base substrate and the thin film transistor and comprises a light transmission hole; the thin film transistor comprises an active layer and a passivation layer which are sequentially arranged on one side of the light shielding layer which is far away from the base substrate, the passivation layer is positioned on one side of the active layer which is far away from the base substrate; the passivation layer comprises a first via hole, and the first via hole is communicated with the light transmission hole. In the embodiment of the present disclosure, the first via hole can be used to form the light transmission hole. The first via hole is located in an area outside the region where the thin film transistor is located.

For example, the orthographic projection of the light transmission hole of the light-shielding layer on the base substrate is completely within the orthographic projection of the first via hole on the base substrate, but the disclosure is not limited thereto. For example, the light transmission hole may be formed by patterning the light-shielding layer through the first via hole. Due to the etching process adopted, the orthogonal projection of the light transmission hole of the light shielding layer on the base substrate may be slightly different from the orthogonal projection of the first via hole on the base substrate.

The array substrate according to the embodiments of the present disclosure will be described below by several examples without limitation. As described below, different features in these specific examples can be combined with each other without conflict, so as to obtain new examples, which are also within the scope of protection of the present disclosure.

Figure 3A:
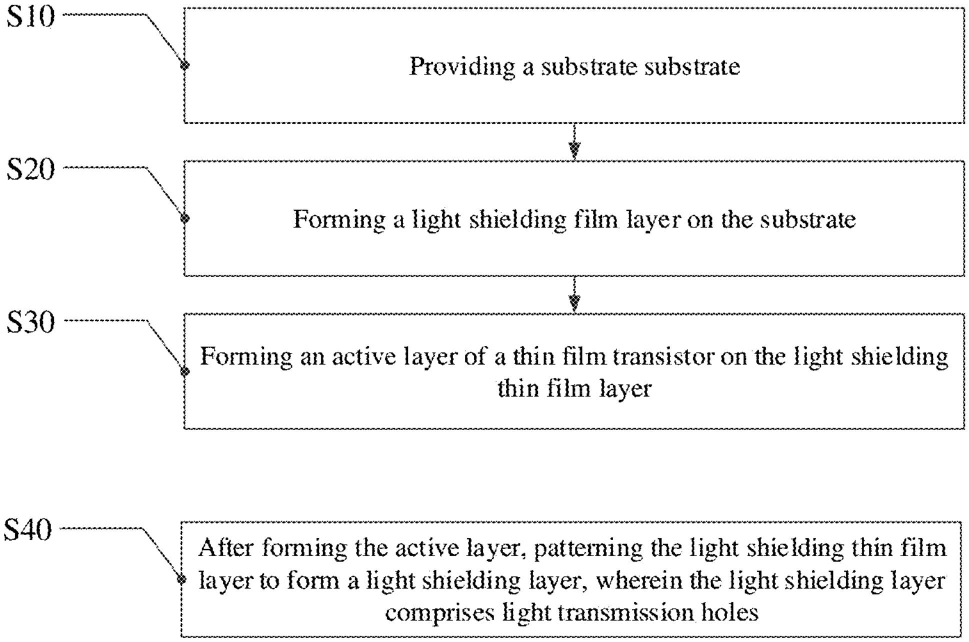
FIG. 3A is an exemplary flowchart of a manufacturing method of an array substrate provided by at least an embodiment of the present disclosure.
Figure 3B:
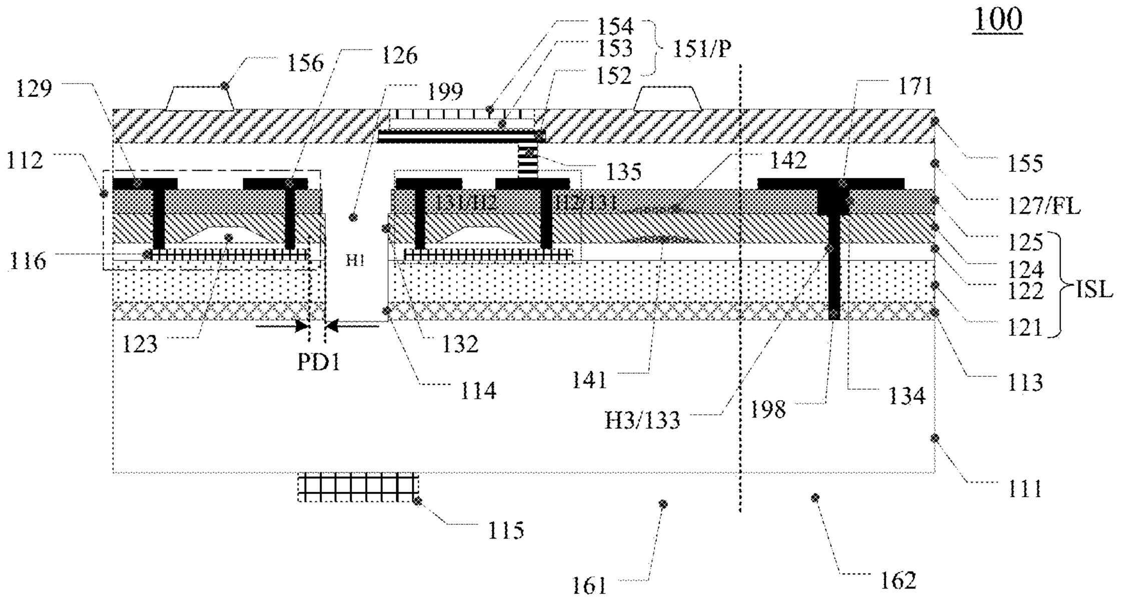
FIG. 3B is an exemplary structural diagram of an array substrate provided by at least an embodiment of the present disclosure.

As illustrated in FIG. 3B, the array substrate 100 includes a base substrate 111, a light shielding layer 113, and a thin film transistor 112. The light shielding layer 113 is between the base substrate 111 and the thin film transistor 112 and includes a light transmission hole 114. The thin film transistor 112 includes an active layer 116 and a passivation layer 124 sequentially disposed on a side of the light shielding layer 113 away from the base substrate 111. For example, the active layer 116 is a semiconductor layer. For example, the active layer 116 may include a polysilicon layer, and the polysilicon layer may be formed of an amorphous silicon layer by an annealing process. For example, the fabrication methods of the base substrate 111, the light shielding layer 113 and the thin film transistor 112 can be seen in the fabrication method of the array substrate provided in the embodiment of the present disclosure, and will not be described here again.

As illustrated in FIG. 3B, the passivation layer 124 includes a first via hole 132; the orthographic projection of the light transmission hole 114 of the light-shielding layer on the base substrate 111 is completely within the orthographic projection of the first via hole 132 on the base substrate 111, but the disclosure is not limited thereto. For example, by providing the first via hole 132 in the passivation layer 124, the light shielding layer 113 can be patterned to form the light transmitting hole 114 after forming the active layer of the thin film transistor (e.g., forming the passivation layer 124), whereby in the annealing process for forming the active layer, the light shielding layer will not cause a temperature difference, thus not affecting the crystal morphology of different parts of the active layer. Therefore, the light shielding layer does not adversely affect the formation of the active layer of the thin film transistor, thereby reducing the adverse effect of the light transmission hole of the light shielding layer on the active layer without reducing the diameter of the light transmission hole of the light shielding layer, further improving the intensity of the diffuse reflection light that is from a finger and incident on the imaging device and correspondingly improving the signal-to-noise ratio of image output by the imaging device. The following description will be made in connection with different embodiments.

It should be noted that the embodiments of the present disclosure are described by taking the light transmission hole 114 of the light-shielding layer in a circular shape as an example, but the embodiment of the present disclosure is not limited to this, and the light transmission hole 114 of the light-shielding layer may also be oval, square, etc. according to actual application requirements.

As illustrated in FIG. 3B, the orthogonal projection of the first via hole 132 on the base substrate 111 and the orthogonal projection of the active layer 116 on the base substrate 111 do not overlap. For example, the first via hole 132 is located between adjacent thin film transistors. Furthermore, for example, the first via hole 132 is located between the active layers 116 of adjacent thin film transistors.

For example, the orthogonal projection of the light transmission hole 114 of the light-shielding layer on the base substrate 111 may completely overlap with the orthogonal projection of the first via hole 132 on the base substrate 111. In this case, the orthogonal projection of the light transmission hole 114 of the light-shielding layer on the base substrate 111 has the same shape and size as the orthogonal projection of the first via hole 132 on the base substrate 111, thereby simplifying the manufacturing process.

As illustrated in FIG. 3B, the thin film transistor 112 further includes a gate insulating layer 122 and a gate electrode 123 disposed between the active layer 116 and the passivation layer 124, and a source electrode 129 and a drain electrode 126 disposed on a side of the passivation layer 124 away from the active layer 116. The first via hole 132 is formed passing through the gate insulating layer 122; the source electrode 129 and the drain electrode 126 are in contact with the active layer 116 through the second via holes 131 formed in the gate insulating layer 122 and the passivation layer 124.

As illustrated in FIG. 3B, the array substrate 100 further includes an interlayer insulating layer 125, a first capacitor electrode 141, and a second capacitor electrode 142. The first capacitor electrode 141 and the second capacitor electrode 142 may at least partially overlap (e.g., completely overlap) in a direction perpendicular to the base substrate 111 to form a capacitor, which may be used, for example, to realize signal storage, threshold compensation function, and the like of a pixel circuit.

As illustrated in FIG. 3B, the interlayer insulating layer 125 is disposed between the passivation layer 124 and the layer where the source electrode 129 and the drain electrode 126 are located. The first capacitor electrode 141 is disposed between the gate insulating layer 122 and the passivation layer 124. In this case, the first capacitor electrode 141 may be formed in the first patterning process of forming the gate electrode 123, thereby reducing process complexity. The second capacitor electrode 142 is disposed between the passivation layer 124 and the interlayer insulating layer 125. In this case, the second capacitor electrode 142 is formed in the second patterning process of forming the light transmission hole 114 of the light-shielding layer, thereby further reducing process complexity.

Figure 3C:
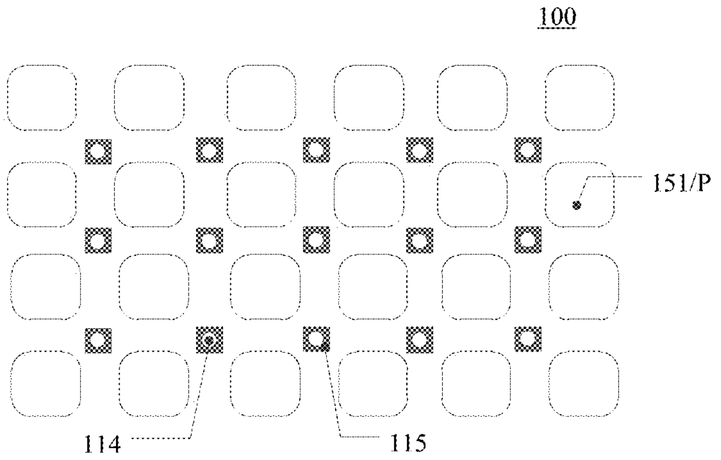
FIG. 3C is an exemplary plan view of an array substrate provided by at least an embodiment of the present disclosure.
Figure 3D:
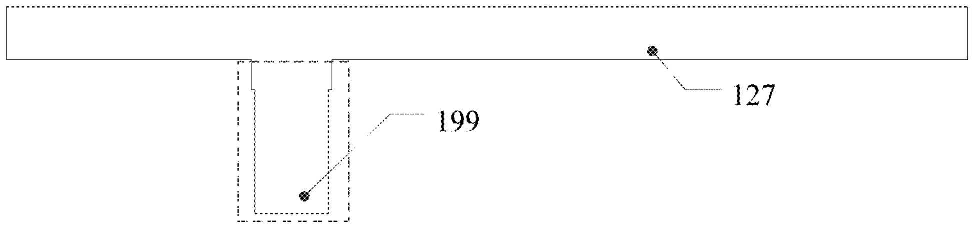
FIG. 3D is a schematic view of the filling structure and planarization layer illustrated in FIG. 3B.

As illustrated in FIG. 3B and FIG. 3D, the array substrate 100 further includes a filling structure 199 filled in the first via hole 132 and the light transmission hole 114, i.e., the filling structure 199 passes through the passivation layer 124 and the light-shielding layer 113. In this case, the first via hole 132 passing through the above-mentioned layers is filled with a single material, thereby avoiding the phenomenon that the intensity of light passing through the light transmission hole 114 of the light-shielding layer decreases due to interfacial reflection between various film layers (e.g., interfacial reflection between the gate insulating layer 122 and the passivation layer 124) over the light transmission hole 114. Therefore, by providing the filling structure 199 in the first via hole 132, the intensity of the diffuse reflection light that is from a finger and incident on the imaging device 115 is further increased, and the signal-to-noise ratio of the image output by the imaging device 115 is improved. For example, as illustrated in FIG. 3B, the first via hole 132 and the light transmission hole 114 are completely filled by the filling structure 199.

As illustrated in FIG. 3B, the array substrate 100 further includes a planarization layer 127 disposed on a side of the interlayer insulating layer 125 away from the active layer 116. In this case, the first via hole 132 may be filled with a material for forming the planarization layer 127. That is, the planarization layer 127 and the filling structure 199 are made of the same material, and the surfaces of the filling structure 199 opposite to each other in the direction perpendicular to the base substrate 111 are in contact with the planarization layer 127 and the base substrate 111, respectively. Because the planarization layer 127 and the filling structure 199 are integrally formed, there may be no interface between the planarization layer 127 and the filling structure 199. For example, the planarization layer 127 here may be used as the filling layer FL to fill the first via hole 132 and the light transmission hole 114, but in the embodiments of the present disclosure, the filling layer FL may not use the planarization layer 127, but may use a layer of another insulating material. For example, the filling layer FL may also adopt any one of the passivation layer 124, the gate insulating layer 122, and the interlayer insulating layer 125, which will be described in the following embodiments.

By providing the filling structure 199 in contact with the planarization layer 127 and the base substrate 111, it is possible to prevent the light intensity through the light transmission hole 114 of the light-shielding layer from decreasing due to the interfacial reflection between the plurality of film layers. For example, the interface reflection between the plurality of film layers includes the interface reflection between the buffer layer 121 and the gate insulating layer 122, the interface reflection between the passivation layer 124 and the gate insulating layer 122, the interface reflection between the interlayer insulating layer 125 and the passivation layer 124, and the interface reflection between the planarization layer 127 and the interlayer insulating layer 125. Therefore, it is possible to further increase the intensity of the diffuse reflection light that is from a finger and incident on the imaging device 115 and the signal-to-noise ratio of the image output by the imaging device 115.

It should be noted that in other embodiments not illustrated, the light transmission hole 114 in the light-shielding layer may be filled with a material for forming the gate insulating layer 124, the passivation layer 124 or the interlayer insulating layer 127 according to the relationship between the step of forming the light transmission hole 114 in the light-shielding layer and other steps.

As illustrated in FIG. 3B, the array substrate 100 includes a display region 161 and a peripheral region 162; the display area 161 may include display pixels arranged in an array, and each display pixel may include at least one light emitting element; the peripheral region 162 may be disposed around the display region 161.

As illustrated in FIG. 3B, the array substrate 100 further includes a third via hole 133 located in the gate insulating layer 122 and the passivation layer 124, a fourth via hole 134 located in the interlayer insulating layer 125, and a connection electrode 171 formed after the interlayer insulating layer 125 is formed and before the planarization layer 127.

As illustrated in FIG. 3B, the orthogonal projection of the third via hole 133 on the base substrate 111 and the orthogonal projection of the fourth via hole 134 on the base substrate 111 at least partially overlap, in which case, the connection electrode 171 may contact the light shielding layer 113 through the third via hole 133 and the fourth via hole 134 (through the electrode filling structure 198 provided in the third via hole 133 and the fourth via hole 134), therefore, the light shielding layer 113 can be electrically connected via the connection electrode 171 and the electric charge accumulated on the light shielding layer 113 can be released, thereby avoiding parasitic capacitance caused by floating of the light shielding layer 113 and warping effect of the thin film transistor 112, and further improving the display quality.

As illustrated in FIG. 3B, the third via hole 133 and the fourth via hole 134 are located in the peripheral region 162 of the array substrate 100, whereby the influence on the normal display of the display region 161 can be avoided. The connection electrode 171 may contact the light shielding layer 113 via the fourth via hole 134 and the third via hole 133, but embodiments of the present disclosure are not limited thereto.

As illustrated in FIG. 3B, the orthographic projection of the third via hole 133 on the base substrate 111 is completely within the orthographic projection of the fourth via hole 134 on the base substrate 111, thereby improving the uniformity of the filling structure 198 and further better releasing the charge accumulated on the light shielding layer 113, but the embodiment of the present disclosure is not limited thereto.

In the embodiment of the present disclosure, the insulating layer may include at least one layer or may be a laminated structure. For example, the insulating layer ISL in FIG. 3B includes a buffer layer 121, a passivation layer 124, a gate insulating layer 122, and an interlayer insulating layer 125, and the insulating layer ISL may also include at least one of the passivation layer 124, the gate insulating layer 122, and the interlayer insulating layer 125.

As illustrated in FIG. 3B, the first through hole H1 penetrates through the insulating layer ISL. For example, as illustrated in FIG. 3B, the first through hole H1 penetrates through the buffer layer 121, the passivation layer 124, the gate insulating layer 122, and the interlayer insulating layer 125. In other embodiments, the first through hole H1 can be adjusted as needed according to the insulating layer ISL.

For example, the source electrode 129 and the drain electrode 126 may contact the active layer 116 through second through holes H2 penetrating at least one of the passivation layer 124, the gate insulating layer 122, and the interlayer insulating layer 125. As illustrated in FIG. 3B, the source electrode 129 and the drain electrode 126 are in contact with the active layer 116 through the second through holes H2 penetrating the passivation layer 124, the gate insulating layer 122, and the interlayer insulating layer 125.

It should be noted that the specific structure of the array substrate 100 is not limited to the structure illustrated in FIG. 3B. According to actual application requirements, the array substrate 100 provided by the embodiment of the present disclosure can also be implemented as the structure illustrated in FIG. 5A to FIG. 5D, the specific structure and manufacturing method can be referred to the manufacturing method of the array substrate provided by the embodiment of the present disclosure, and will not be described here again.

Figure 6:
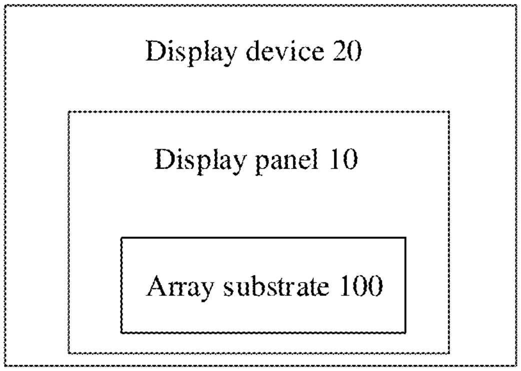
FIG. 6 is a schematic block diagram of a display panel and a display device provided by at least an embodiment of the present disclosure.

At least an embodiment of the present disclosure further provides a display panel 10 and a display device 20, and FIG. 6 shows an exemplary block diagram of the display panel 10 and the display device 20 provided by at least an embodiment of the present disclosure. For example, as illustrated in FIG. 6, the display panel 10 includes the array substrate 100 provided by any embodiment of the present disclosure, and the display device 20 includes the array substrate 100 provided by any embodiment of the present disclosure or the display panel 10 provided by any embodiment of the present disclosure. The display panel 10 and the display device 20 can have improved imaging quality.

For example, the display device 20 can be any product or component with a display function such as a mobile phone, a tablet computer, a television, a display, a notebook computer, a digital photo frame, a navigator, etc. It should be noted that suitable conventional components can be used for other essential components of the display panel 10 and the display device 20 (e.g., thin film transistor control device, image data encoding/decoding device, row scan driver, column scan driver, clock circuit, etc.), which should be understood by those of ordinary skill in the art, are not described in detail herein, and should not be taken as a limitation to the present invention.

At least an embodiment of the present disclosure provides a manufacturing method of an array substrate, comprising: providing a base substrate; forming a light shielding layer on the base substrate; and forming a thin film transistor on the light shielding layer. For example, forming the thin film transistor includes forming an active layer of the thin film transistor. The light shielding layer is patterned to form a light transmission hole after forming an active layer of the thin film transistor.

The manufacturing method of the array substrate according to the embodiments of the present disclosure will be described below through several examples without limitation. As described below, different features in these specific examples can be combined with each other under the condition that they do not conflict with each other, so as to obtain new examples, which are also within the scope of protection of the present disclosure.

A manufacturing method of an array substrate comprises the following steps: providing a base substrate; forming a light shielding film layer on the base substrate; forming an active layer of a thin film transistor on the light shielding thin film layer; and after forming the active layer, patterning the light shielding film layer to form a light shielding layer, wherein the light shielding layer includes light transmission holes.

For example, as illustrated in FIG. 3A, the manufacturing method of the array substrate provided by at least an embodiment of the present disclosure includes the following steps.

Step S10: a base substrate is provided.

Step S20: a light shielding film layer is formed on the base substrate.

Step S30: an active layer of a thin film transistor is formed on the light shielding thin film layer.

Step S40: after forming the active layer, the light shielding film layer is patterned to form a light shielding layer, and the light shielding layer includes light transmission holes.

For example, a patterning process may be used to pattern the light-shielding thin film layer to form light transmission holes, but embodiments of the present disclosure are not limited thereto. For example, the light transmission holes of the light-shielding layer may be all disposed in the display area of the array substrate, but the embodiments of the present disclosure are not limited thereto. For example, according to actual application requirements, part of the light transmission holes of the light-shielding layer can also be arranged in the peripheral area of the array substrate.

For example, by patterning the light-shielding thin film layer to form light transmission holes after forming the active layer of the thin film transistor, the light-shielding thin film layer will not cause temperature difference in the annealing process for forming the active layer, thus not affecting the crystal morphology of different parts of the active layer. Therefore, the light-shielding thin film layer does not adversely affect the formation of the active layer of the thin film transistor, thereby reducing the adverse effect of the light transmission hole of the light-shielding layer on the active layer without reducing the diameter of the light transmission hole of the light-shielding layer, further improving the intensity of the diffuse reflection light that is from a finger and incident on the imaging device and correspondingly improving the signal-to-noise ratio of image output by the imaging device. The following description will be made with reference to different embodiments.

FIG. 3B is an exemplary structural diagram of an array substrate according to at least an embodiment of the present disclosure, and the array substrate can be obtained using the manufacturing method of the array substrate illustrated in FIG. 3A. For example, the array substrate 100 includes a base substrate 111, a light shielding layer 113, and a thin film transistor 112, which are formed on the base substrate 111. For example, the array substrate 100 further includes a light emitting element 151.

For example, the thin film transistor 112 may include a driving transistor for driving the light emitting element 151 to emit light, a switching transistor for controlling whether a data signal is applied to the driving transistor, or the like. For example, the thin film transistor 112 includes an active layer 116, a gate insulating layer 122, a gate electrode 123, a passivation layer 124, and a source electrode 129 and a drain electrode 126, which are sequentially disposed on the light shielding layer 113. Here, the source electrode 129 and the drain electrode 126 are in contact with the active layer 116 through the second via holes 131 formed in the gate insulating layer 122 and the passivation layer 124.

It should be noted that the manufacturing method of the array substrate according to at least an embodiment of the present disclosure is not only suitable for manufacturing a top gate type thin film transistor as illustrated in FIG. 3B, but also suitable for manufacturing a bottom gate type thin film transistor, which will not be repeated here.

For example, the light shielding layer 113 may be made of a metal material (e.g., metal molybdenum). In this case, as illustrated in FIG. 3B, a buffer layer 121 is further provided between the light shielding layer 113 and the thin film transistor 112 to electrically insulate the light shielding layer 113 from the thin film transistor 112. For example, the light shielding layer 113 may be made of a non-metallic material (e.g., an opaque metal oxide such as chromium oxide), and then a buffer layer may not be provided in this example. An imaging device 115 is also provided on the side of the base substrate 111 away from the light shielding layer 113. The imaging device 115 and the light transmission hole 114 of the light shielding layer at least partially overlap in the direction perpendicular to the base substrate 111 to increase the intensity of the diffuse reflection light that is from a finger and incident on the imaging device 115 and to improve the signal-to-noise ratio of image output by the imaging device 115. For example, the imaging device 115 may respond according to the intensity of light irradiated thereon to synthesize an image of a fingerprint and further for identifying the fingerprint, but the disclosure is not limited thereto.

For example, as illustrated in FIG. 3C, the array substrate includes a plurality of light emitting elements 151, a plurality of light transmitting holes 114, and a plurality of imaging devices 115. The plurality of light-emitting elements 151, the plurality of light transmission holes 114 and the plurality of imaging devices 115 are respectively arranged in arrays, the orthographic projection of each light transmission hole 114 and the corresponding imaging device 115 on the base substrate 111 at least partially overlaps, and the orthographic projection of each light transmission hole 114 on the base substrate 111 is arranged between the orthographic projections of the adjacent light-emitting elements 151 on the base substrate 111. The arrangement of the plurality of light emitting elements 151 and the arrangement of the plurality of light transmitting holes 114 may not be limited to that of FIG. 3C. For example, in the horizontal direction of FIG. 3C, one imaging device 115 may be provided for every 8 through 10 light emitting elements 151.

For example, as illustrated in FIG. 3B, a planarization layer 127 and a light emitting element 151 that is in contact with the source electrode or drain electrode of the thin film transistor 112 via hole a fifth via hole 135 in the planarization layer 127 are further provided on the side of the thin film transistor 112 away from the base substrate 111. For example, the light emitting element 151 is an organic light emitting diode, and includes a first electrode 152, a pixel defining layer 155, a light emitting layer 153, and a second electrode 154 which are sequentially arranged. The first electrode 152 and the second electrode 154 may be an anode and a cathode, respectively, but embodiments of the present disclosure are not limited thereto. In another example, only the first electrode 152 and the pixel defining layer 155 may be provided on the side of the planarization layer 127 away from the base substrate 111 to form a driving backplate. In this case, the light emitting layer 153 and the second electrode 154 may be formed in a subsequent manufacturing process.

As illustrated in FIG. 3B and FIG. 3C, the array substrate includes a plurality of pixels P, and the light transmission holes 114 are at least partially located between the pixels P. For example, a pixel P is the smallest light emitting unit. The pixel P includes a light emitting element 151, but is not limited thereto. For example, the pixel may also be a display pixel in a liquid crystal display device. For example, the orthogonal projection of the light transmission hole 114 on the base substrate may also be located within the orthogonal projection of the pixel P on the base substrate. The position of the light transmission hole 114 can be selected as required as long as it is not shielded by a light-shielding element/component. For example, the orthogonal projection of the light transmission hole 114 on the base substrate does not overlap with the orthogonal projection of the thin film transistor on the base substrate, so as to prevent light rays from being blocked by elements such as a gate electrode, a source electrode, a drain electrode and the like of the thin film transistor from passing through the light transmission hole 114.

As illustrated in FIG. 3B, a first via hole 132 is formed in the buffer layer 121, the gate insulating layer 122, the passivation layer 124, and the interlayer insulating layer 125 to expose the light transmission hole 114. For example, the material for forming the planarization layer 127 fills the first via hole 132, that is, the first via hole 132 passing through the above-mentioned layers is filled with a single material, whereby the phenomenon that the intensity of light passing through the light transmission hole 114 of the light-shielding layer decreases due to interfacial reflection between various film layers (e.g., interfacial reflection between the gate insulating layer 122 and the passivation layer 124) over the light transmission hole 114 can be avoided. Therefore, by filling the first via hole 132 with the material for forming the planarization layer 127, the intensity of the diffuse reflection light that is from a finger and incident on the imaging device 115 is further increased, and the signal-to-noise ratio of the image output by the imaging device 115 is improved.

For example, as illustrated in FIG. 3B, the array substrate 100 further includes a connection electrode 171 disposed in a peripheral region 162 of the array substrate 100. The connection electrode 171 is in contact with the light shielding layer 113 through the third via hole 133, and can electrically connect the light shielding layer 113 through the connection electrode 171 and release charges accumulated on the light shielding layer 113, thereby avoiding parasitic capacitance caused by floating of the light shielding layer 113 and warping effect of the thin film transistor 112, and further improving display quality.

In the embodiment of the present disclosure, the connection electrode 171 is connected to the light shielding layer 113 through the third through hole H3. The third through hole H3 is a via hole penetrating the insulating layer between the connection electrode 171 and the light shielding layer. The third through hole H3 may be the third through hole 133, but is not limited thereto. For example, when the connection electrode 171 is disposed on the same layer as the gate electrode 123, the third through hole H3 may penetrate only the gate insulating layer.

For example, as illustrated in FIG. 3B, the array substrate 100 further includes a first capacitor electrode 141 and a second capacitor electrode 142. the first capacitor electrode 141 and the second capacitor electrode 142 may at least partially overlap (e.g., completely overlap) in the direction perpendicular to the base substrate 111 to form a capacitor, which may be used to realize signal storage, threshold compensation function, etc. of a pixel circuit, for example.

For example, as illustrated in FIG. 3B, in a case where the array substrate 100 further includes a first capacitor electrode 141 and a second capacitor electrode 142, the array substrate 100 further includes an interlayer insulating layer 125 disposed between the passivation layer 124 and the planarization layer 127, the first capacitor electrode 141 may be disposed between the gate insulating layer 122 and the passivation layer 124 of the thin film transistor 112, and the second capacitor electrode 142 may be disposed between the passivation layer 124 and the interlayer insulating layer 125 of the thin film transistor 112 to reduce process complexity, but the embodiments of the present disclosure is not limited thereto.

For example, as illustrated in FIG. 3B, the array substrate 100 further includes a plurality of spacers 156 disposed on a side surface of the pixel defining layer 155 away from the base substrate 111, and includes a cover plate (not illustrated in FIG. 3B) disposed on a side surface of the plurality of spacers 156 away from the base substrate 111. For example, the orthogonal projection of each spacer 156 on the array substrate 100 and the orthogonal projection of the first electrode 152 on the array substrate 100 are arranged at an interval, so that the force applied to the cover plate can be prevented from being transmitted to the light emitting layer 153, and further the display quality of the display panel 10 including the array substrate 100 can be ensured. In another example, a plurality of spacers 156 may not be provided.

For example, the manufacturing method of an array substrate provided by the embodiment of the present disclosure will be exemplarily described below with reference to FIG. 4A to FIG. 4O, the finally obtained array substrate corresponds to the array illustrated in FIG. 3B, however, corresponding modifications can be made as required, such as adding or reducing some layer structures, such as layer structures above light transmission holes in the light-shielding layer, etc. therefore, the embodiments of the present disclosure are not limited to the embodiment illustrated in the figure. For example, as illustrated in FIG. 4A to FIG. 4O, the manufacturing method of the array substrate may include the following steps.

Figure 4A:
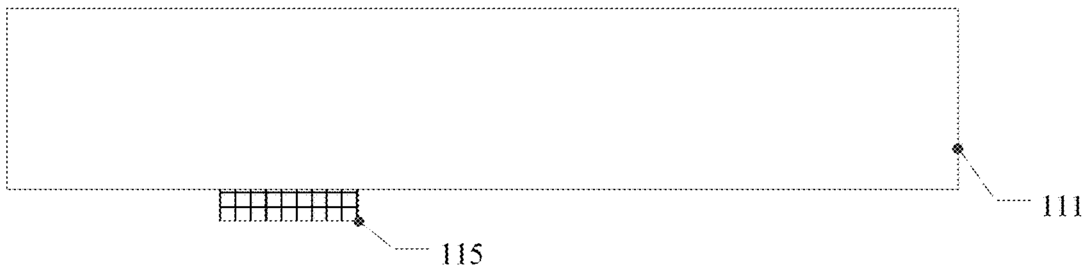
FIG. 4A to FIG. 4O are schematic diagrams of a manufacturing method of an array substrate provided by at least an embodiment of the present disclosure.

Step S201: a base substrate 111 is provided (see FIG. 4A).

For example, the base substrate 111 may be a flexible base substrate 111, but embodiments of the present disclosure are not limited thereto. According to actual application requirements, the base substrate 111 may also be inflexible rigid base substrates (e.g., glass substrate and semiconductor base substrate). For example, the flexible base substrate 111 may be a metal foil, thin glass, or a plastic substrate (e.g., a base substrate made of polyimide), but embodiments of the present disclosure are not limited thereto. For example, the minimum value of the bending radius of the base substrate 111 may be between 10 mm and 30 mm (e.g., 20 mm), but embodiments of the present disclosure are not limited thereto. For example, if the minimum bending radius of the base substrate 111 is 20 mm and the base substrate 111 is wound around a cylinder with a radius of 20 mm for 10,000 times, the base substrate 111 can operate without failure.

For example, according to actual application requirements, an imaging device 115 may be provided on one side surface of the base substrate 111 (i.e., one side surface of the base substrate 111 away from the light shielding layer 113), and the imaging device 115 and the light transmission hole 114 of the light shielding layer may at least partially overlap in the direction perpendicular to the base substrate 111. Although the imaging device 115 is illustrated in FIG. 4A, the imaging device 115 may be mounted to one side of the base substrate 111 after the fabrication of the array substrate is completed.

For example, the specific structure and type of the imaging device 115 can be set according to actual application requirements, and the embodiments of the present disclosure do not have specific limitation in this aspect. For example, the imaging device 115 includes a plurality of imaging pixels, each imaging pixel may include a photodiode that can convert an optical signal irradiated thereon into an electrical signal, and a switching transistor that may be electrically connected to the photodiode to control whether the photodiode is in a state of collecting an optical signal and the time period when the optical signal is collected. For example, the type and setting mode of photodiodes can be determined according to actual application requirements, and the embodiments of the present disclosure are not specifically limited to this. For example, the photodiode may be a PIN junction type photodiode or a phototransistor, and thus the response speed of the photodiode may be improved.

Figure 4B:
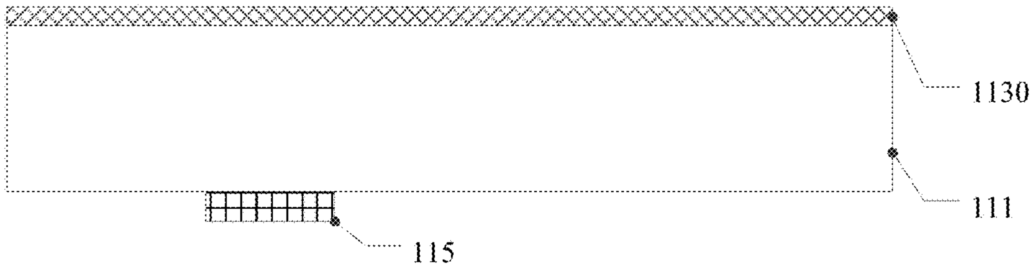

Step S202: a light shielding thin film layer 1130 is formed on the base substrate 111 (see FIG. 4B).

For example, the light shielding film layer 1130 may be made of metal, light absorbing material, black light shielding material, or other suitable materials. For example, when the light shielding film layer 1130 is metal, the light shielding film layer 1130 may be formed of molybdenum metal. For example, in the present disclosure, the embodiments of the present disclosure is described by taking the light shielding film layer 1130 being a metal as an example, but the embodiments of the present disclosure are not limited thereto. For example, according to actual application requirements, before forming the light shielding thin film layer 1130, a protection layer (not illustrated in the figure) may be formed on the base substrate 111, which can alleviate oxidation problems caused by water vapor or oxygen in air to provide an insulating function, for example.

Figure 4C:
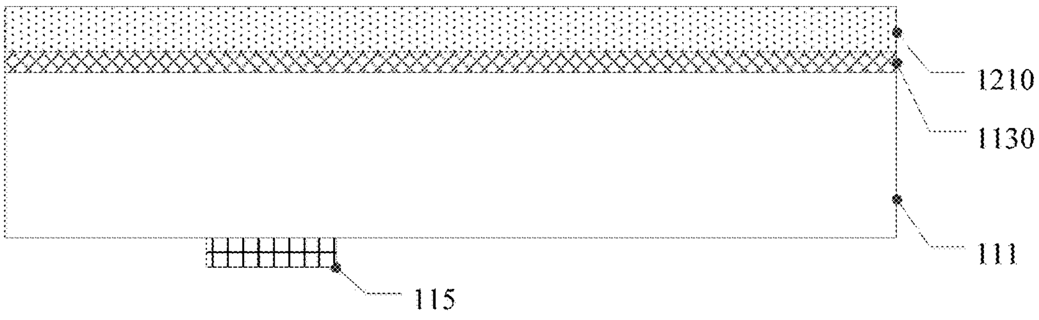

Step S203: a buffer film layer 1210 is formed on the light shielding film layer 1130 (see FIG. 4C).

For example, the buffer film layer 1210 may be made of a transparent insulating material and used to electrically insulate the light shielding film layer 1130 and the thin film transistor 112 disposed on opposite sides of the buffer film layer 1210. For example, the buffer film layer 1210 may be formed of an inorganic material or an organic material, and the buffer film layer 1210 may be formed of, for example, organic resin, silicon oxide (SiOx), silicon oxynitride (SiNxOy), or silicon nitride (SiNx), but embodiments of the present disclosure are not limited thereto.

Figure 4D:
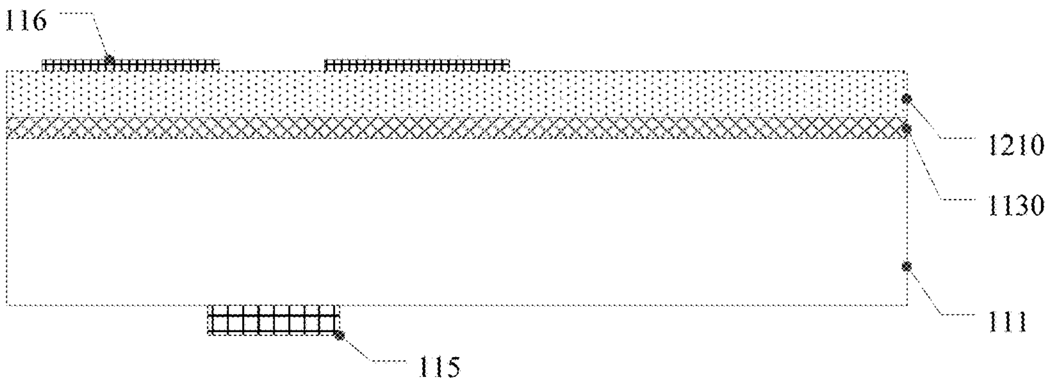

Step S204: the active layer 116 of the thin film transistor 112 is formed on the buffer thin film layer 1210 (see FIG. 4D).

For example, forming the active layer 116 of the thin film transistor 112 includes first forming an amorphous silicon layer, then performing an annealing process on the amorphous silicon layer to convert the amorphous silicon layer into a polysilicon layer, and then patterning the polysilicon layer to obtain a patterned active layer. For example, performing an annealing process on the amorphous silicon layer includes irradiating the amorphous silicon layer with laser light (e.g., laser light output from an excimer laser); the amorphous silicon layer absorbs laser light and generates heat, thereby gradually changing from a surface melting state to a completely melting state; during the cooling process, the amorphous silicon layer can be transformed into a polysilicon layer. For example, the specific method for performing the annealing process on the amorphous silicon layer can be, for example, an excimer laser annealing process, and will not be described here again. The crystallization process can also be metal induced crystallization (MIC) process (such as metal lateral induced crystallization (MILC)), solid phase crystallization (SPC) process, sequential lateral crystallization (SLC) process and other crystallization processes. For example, the active layer 116 may be formed by patterning the active thin film layer by forming the active thin film layer. For example, the active thin film layer may be a planar structure covering the base substrate. For example, the active thin film layer may cover at least the display region 161 of the array substrate 100.

The active layer 116 of the thin film transistor 112 is made of a semiconductor material. For example, in another example of this embodiment, the active layer 116 is made of a metal oxide semiconductor material including indium gallium zinc oxide (IGZO), zinc oxide, and the like. After the thin film of the metal oxide semiconductor material is formed, it is annealed to improve the electrical characteristics thereof.

As described below in connection with FIG. 4D and FIG. 4J, after forming the active layer 116 of the thin film transistor 112, the light shielding thin film layer 1130 is patterned to form the light transmission holes 114, thereby forming the light shielding layer 113. Because there is no temperature difference caused by the light transmission holes 114 of the light-shielding layer in the light-shielding thin film layer 1130 during the annealing process for the active layer, there is no need to set a second predetermined pitch PD2 (e.g., 1 micron or 2 microns) corresponding to the annealing temperature difference between the orthogonal projection of the active layer 116 of the thin film transistor 112 on the light-shielding layer 113 and the light transmission holes 114 of the adjacent light-shielding layer. Therefore, the diameter of the light transmission hole 114 of the light-shielding layer can be correspondingly increased (for example, the radius is increased by 2 microns or 4 microns), thereby improving the intensity of the diffuse reflection light that is from a finger and incident on the imaging device 115 and the signal-to-noise ratio of the image output by the imaging device 115.

Figure 4E:
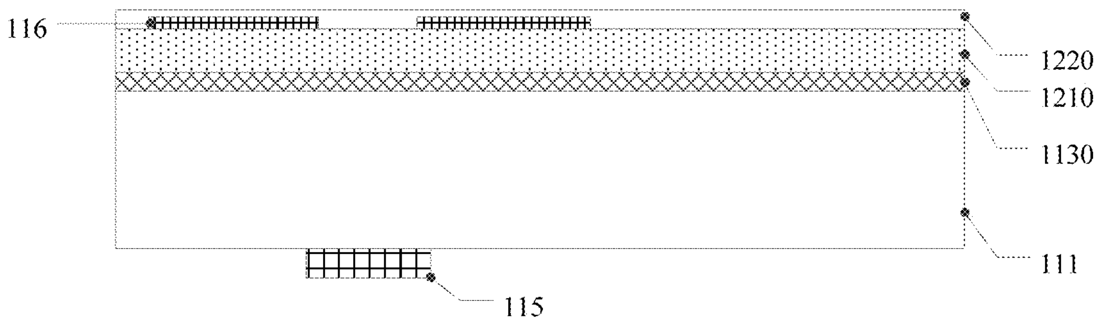

Step S205: a gate insulating thin film layer 1220 of the thin film transistor 112 is formed on the active layer 116 (see FIG. 4E).

For example, the gate insulating thin film layer 1220 of the thin film transistor 112 may be formed of an inorganic material or an organic material, and the gate insulating thin film layer 1220 may be formed of, for example, organic resin, silicon oxide (SiOx), silicon oxynitride (SiNxOy), or silicon nitride (SiNx), but embodiments of the present disclosure are not limited thereto.

Figure 4F:
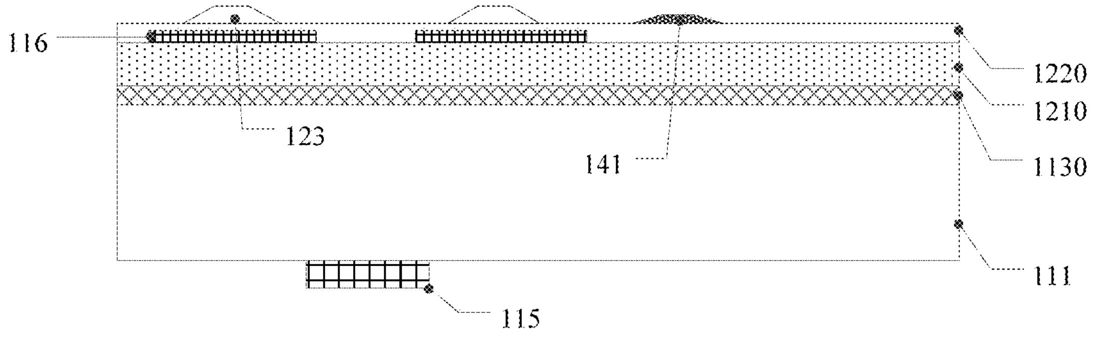

Step S206: the first capacitor electrode 141 and the gate electrode 123 of the thin film transistor 112 are formed on the gate insulating thin film layer 1220 (see FIG. 4F).

For example, the gate electrode 123 and the first capacitor electrode 141 of the thin film transistor 112 are both formed of a metal material (e.g., copper, aluminum, or aluminum alloy), but embodiments of the present disclosure are not limited thereto. It should be noted that although the gate electrode 123 and the first capacitor electrode 141 of the thin film transistor 112 adopt different filling patterns illustrated in FIG. 4F, the gate electrode 123 and the first capacitor electrode 141 of the thin film transistor 112 can be made of the same material to simplify the process and reduce the manufacturing costs. For example, as illustrated in FIG. 4F, the thickness of the gate electrode 123 and the first capacitor electrode 141 of the thin film transistor 112 are different in the direction perpendicular to the array substrate. In another example, the thickness of the gate electrode 123 and the first capacitor electrode 141 of the thin film transistor 112 in the direction perpendicular to the array substrate may also be the same.

Figure 4G:
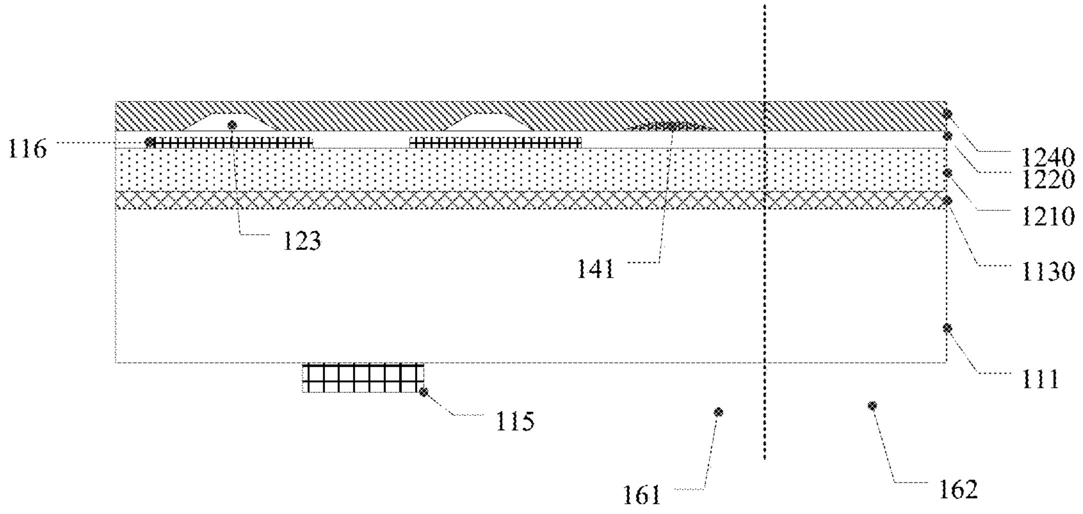

Step S207: a passivation thin film layer 1240 of the thin film transistor 112 is formed on the gate electrode 123 of the thin film transistor 112 (see FIG. 4G).

For example, the passivation film layer 1240 of the thin film transistor 112 may be formed of an inorganic material or an organic insulating material, and the passivation film layer 1240 may be formed of, for example, organic resin, silicon oxide (SiOx), silicon oxynitride (SiNxOy), or silicon nitride (SiNx), but embodiments of the present disclosure are not limited thereto.

Figure 4H:
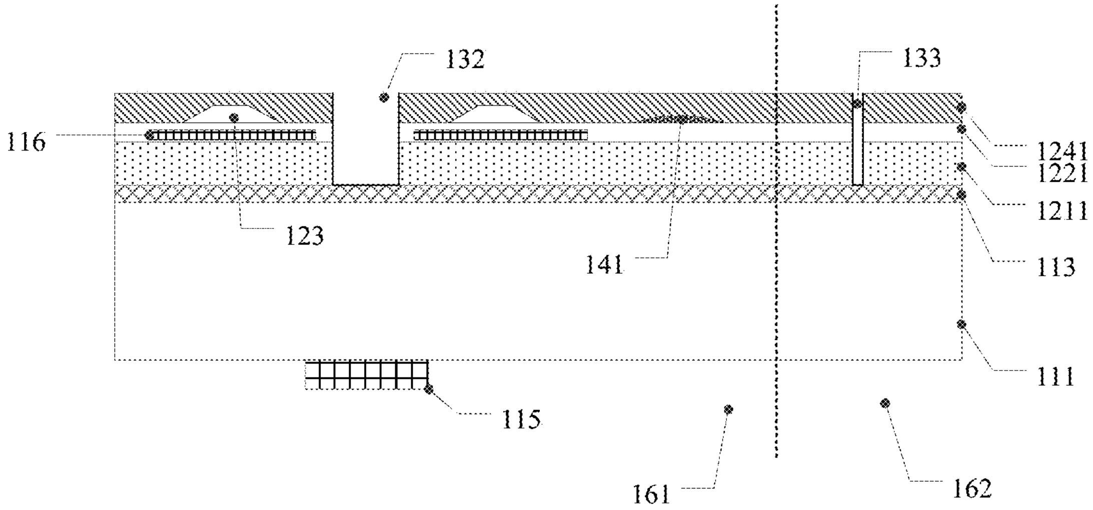

Step S208: the first via hole 132 and the third via hole 133 are formed in the passivation thin film layer 1240 of the thin film transistor 112 and the gate insulating thin film layer 1220 of the thin film transistor 112 (see FIG. 4H).

For example, the first via hole 132 and the third via hole 133 may be formed in the passivation thin film layer 1240 of the thin film transistor 112 and the gate insulating thin film layer 1220 of the thin film transistor 112 by a patterning process, thereby forming the gate insulating intermediate layer 1221 and the passivation intermediate layer 1241. For example, in a case where the array substrate 100 further includes a material of the buffer layer 121, the first via hole 132 and the third via hole 133 pass through the buffer film layer 1210, thereby forming a buffer interlayer 1211, to expose the light shielding film layer 1130.

For example, forming the first via hole 132 and the third via hole 133 in the passivation thin film layer 1240 of the thin film transistor 112 and the gate insulating thin film layer 1220 of the thin film transistor 112 by a patterning process may include the following steps S101- to S103.

Step S101: a layer of photoresist is coated on the passivation film layer 1240, and a photoresist pattern is formed after exposure and development processes.

Step S102: the gate insulating film layer 1220 and the passivation film layer 1240 exposed through the photoresist pattern are etched (e.g., dry etching) to form the first via hole 132 and the third via hole 133.

Step S103: the remaining photoresist is removed.

For example, because the first via hole 132 and the third via hole 133 can be formed in same one patterning process, there is no need to provide an additional via hole patterning process for forming the first via hole 132 for patterning the light shielding thin film layer 1130, thereby avoiding lowering the manufacturing efficiency of the array substrate 100 and the display device and avoiding increasing the manufacturing costs of the array substrate 100 and the display device.

Figure 4I:
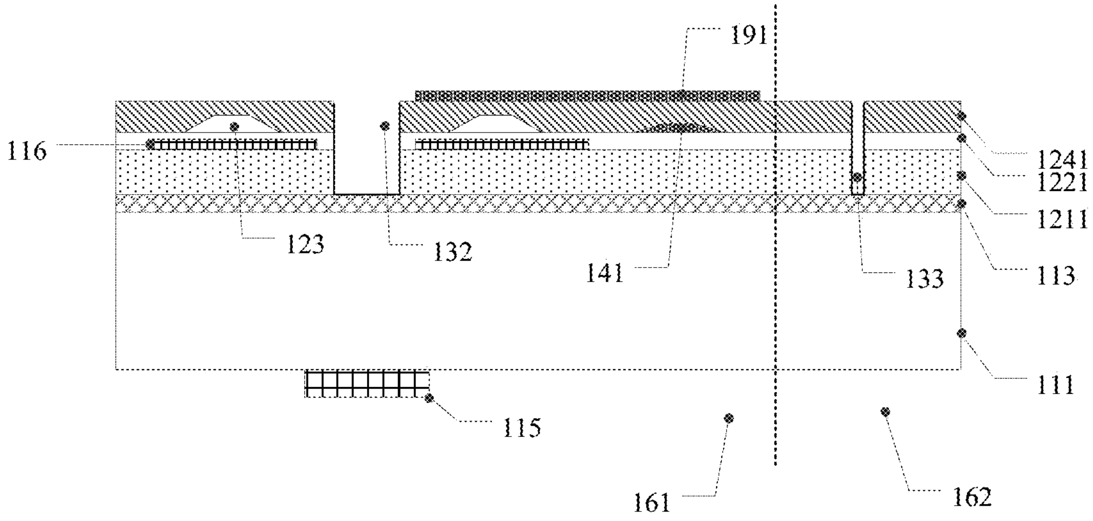

Step S209: forming a capacitor electrode metal layer 191 on the passivation intermediate layer 1241 of the thin film transistor 112 (see FIG. 4I). It should be noted that when forming the capacitor electrode metal layer 191, the first via hole 132 and the third via hole 133 may be shielded to prevent the material for forming the capacitor electrode metal layer 191 from filling the first via hole 132 and the third via hole 133, but embodiments of the present disclosure are not limited thereto.

Figure 4J:
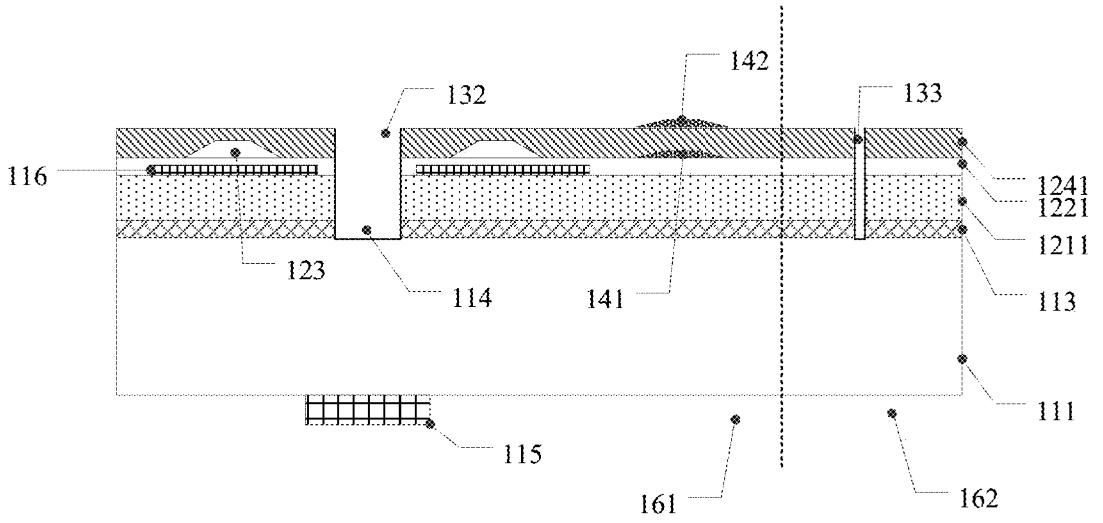

Step S210: patterning the capacitor electrode metal layer 191 to form the second capacitor electrode 142, and in the same process, patterning the light shielding thin film layer 1130 via the first via hole 132 to form the light transmission hole 114 of the light shielding layer 113 (see FIG. 4J).

For example, by patterning the capacitor electrode metal layer 191 and the light shielding thin film layer 1130 in the same patterning process, it is unnecessary to add an additional patterning process to form the light transmission hole 114 of the light shielding layer; therefore, under the condition of increasing the diameter of the light transmission hole 114, the combination of step S210 and step S208 can not only eliminate the additional patterning process for forming the first via hole 132 for patterning the light shielding thin film layer 1130, but also omit the patterning process for the light shielding thin film layer 1130 (for forming the light transmission hole 114) in the conventional manufacturing method of the array substrate. Thus, in the manufacturing method of the array substrate provided by the embodiment of the present disclosure, the manufacturing efficiency of the array substrate 100 and the display device can be further improved (for example, the production capacity of the drive backplate or the array substrate can be increased from 24,000 pieces per month to 32,000 pieces per month), and the manufacturing costs of the array substrate 100 and the display device can be further reduced.

For example, the capacitor electrode metal layer 191 may be made of the same material (e.g., molybdenum metal) used to make the light shielding layer 113. In this case, even if the capacitor electrode metal layer 191 and the light shielding film layer 1130 are patterned in the same patterning process, because the material properties of the capacitor electrode metal layer 191 and the light shielding film layer 1130 are the same, a good etching effect can be obtained.

Figure 4K:
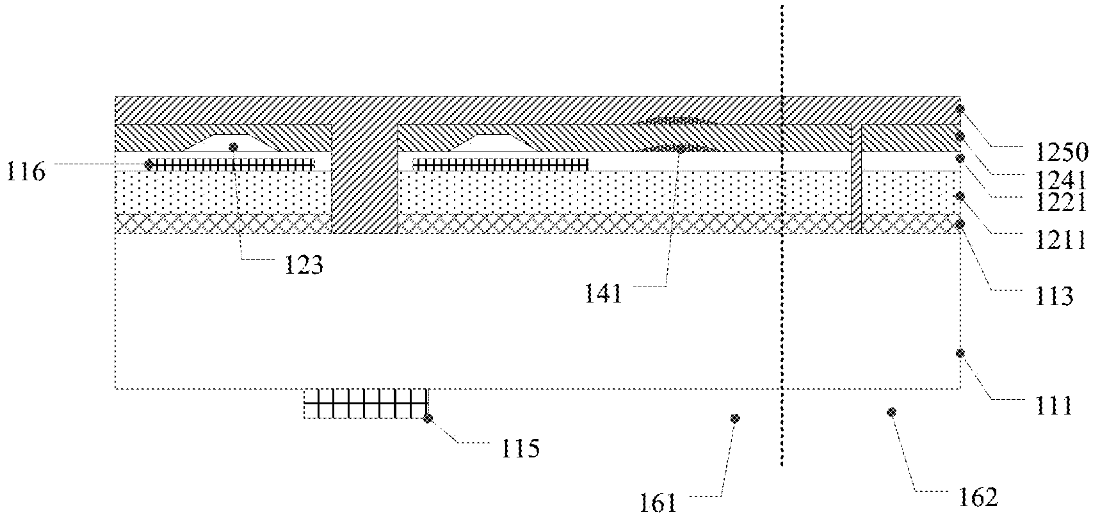

Step S211: forming an interlayer insulating film layer 1250 on the second capacitor electrode 142 (see FIG. 4K).

For example, the interlayer insulating film layer 1250 may be made of a transparent insulating material. For example, the interlayer insulating film layer 1250 may be formed of an inorganic material or an organic material, and the interlayer insulating film layer 1250 may be formed of, for example, an organic resin, silicon oxide (SiOx), silicon oxynitride (SiNxOy), or silicon nitride (SiNx), but embodiments of the present disclosure are not limited thereto.

Figure 4L:
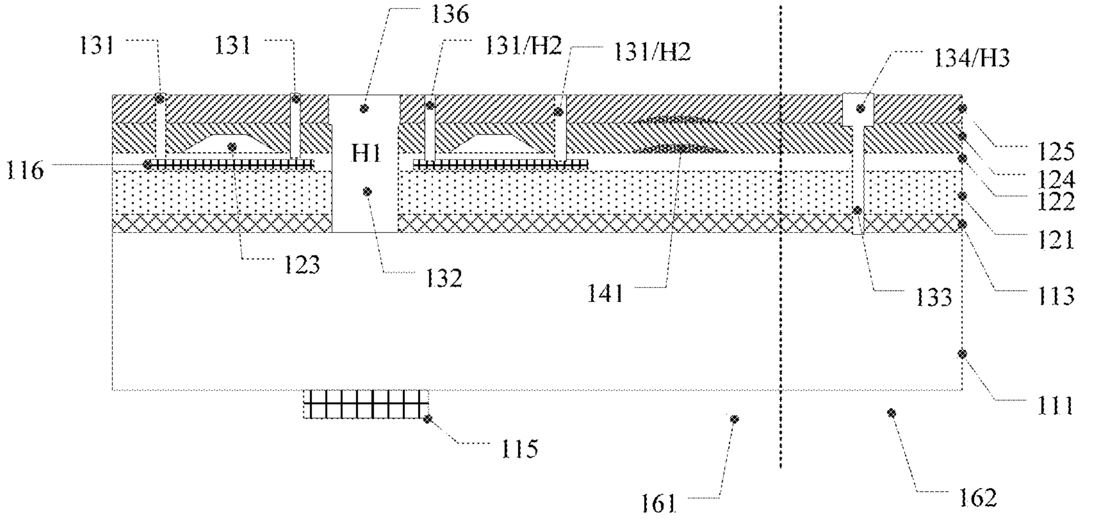

Step S212: forming second via holes 131 in the interlayer insulating thin film layer 1250, the passivation intermediate layer 1241 of the thin film transistor 112, and the gate insulating intermediate layer 1221 of the thin film transistor 112 to expose the source region and the drain region of the active layer 116, and in the same process, forming a sixth via hole 136 and a fourth via hole 134 in the interlayer insulating thin film layer 1250 to expose the first via hole 132 and the third via hole 133, respectively (see FIG. 4L), thereby forming the first through hole H1, the second through hole H2, and the third through hole H3.

For example, by a patterning process, forming the second via holes 131 in the interlayer insulating thin film layer 1250, the passivation intermediate layer 1241 of the thin film transistor 112, and the gate insulating intermediate layer 1221, and forming the sixth via hole 136 and the fourth via hole 134 in the interlayer insulating thin film layer 1250, include the following steps S111- to S113.

Step S111: coating photoresist on the interlayer insulating film layer 1250, and forming a photoresist pattern after exposure and development processes.

Step S112: etching the interlayer insulating thin film layer 1250, the passivation intermediate layer 1241 and the gate insulating intermediate layer 1221 of the thin film transistor 112 exposed through the photoresist pattern (e.g., dry etching) to form the first via hole 132 and the third via hole 133.

Step S113: removing the remaining photoresist.

For example, because the second via holes 131, the sixth via hole 136, and the fourth via hole 134 can be formed in the same patterning process, there is no need to add an additional patterning process for forming the sixth via hole 136 and the fourth via hole 134 (to expose the first via hole 132 and the third via hole 133, respectively), thereby improving the manufacturing efficiency of the array substrate 100 and the display device, and reducing the manufacturing costs of the array substrate 100 and the display device.

For example, by forming the first via hole 132 and the sixth via hole 136 before and after forming the interlayer insulating layer 125, respectively, the problem that the light shielding layer 113 cannot be exposed through the first via hole 132 due to insufficient etching depth, which problem may exist in a single patterning (for example, for forming the first via hole 132 in a patterning process for forming the second via holes 131), can be avoided.

For example, in another example, in step S212, when the second via holes 131 are formed, the sixth via hole 136 is not formed (i.e., the material for forming the interlayer insulating layer 125 filled in the first via hole 132 and the light transmission hole 114 of light-shielding layer in step S211 is not removed), then finally the material of the interlayer insulating layer 125 fills the first via hole 132 and the light transmission hole 114 of the light-shielding layer (see FIG. 5A), whereby interfacial reflection can be reduced, furthermore, the intensity of the diffuse reflection light that is from a finger and incident on the imaging device 115 can be increased, and the signal-to-noise ratio of the image output by the imaging device 115 can be increased.

Figure 4M:
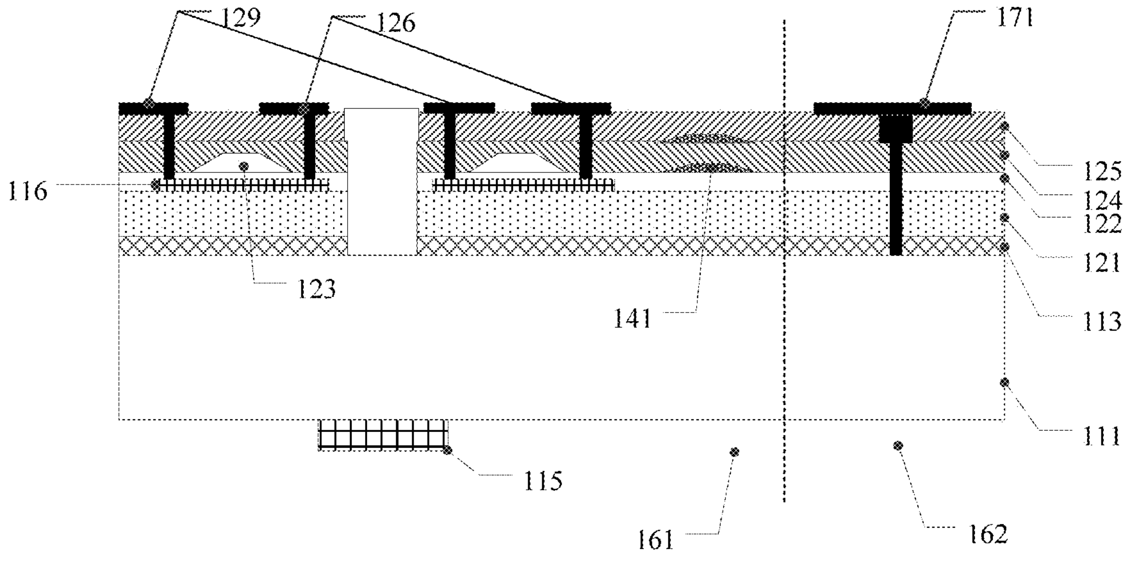

Step S213: forming the source electrode 129 and the drain electrode 126 of the thin film transistor 112 to contact the active layer 116 through the second via holes 131 in the interlayer insulating layer 125, the passivation layer 124, and the gate insulating layer 122. Also, in the same process, the connection electrode 171 is formed to contact the light shielding layer 113 via the fourth via hole 134 in the interlayer insulating layer 125 and the third via hole 133 in the passivation layer 124, the gate insulating layer 122, and the buffer layer 121 (see FIG. 4M).

For example, by forming the connection electrode 171 in the process of forming the source electrode 129 and the drain electrode 126 of the thin film transistor 112, not only can parasitic capacitance and warping effect of the thin film transistor 112 caused by floating of the light shielding layer 113 be avoided, but also an additional conductive material deposition process and a patterning process need not be added, thus the manufacturing efficiency of the array substrate 100 and the display device can be improved, and the manufacturing costs of the array substrate 100 and the display device can be reduced.

Figure 4N:
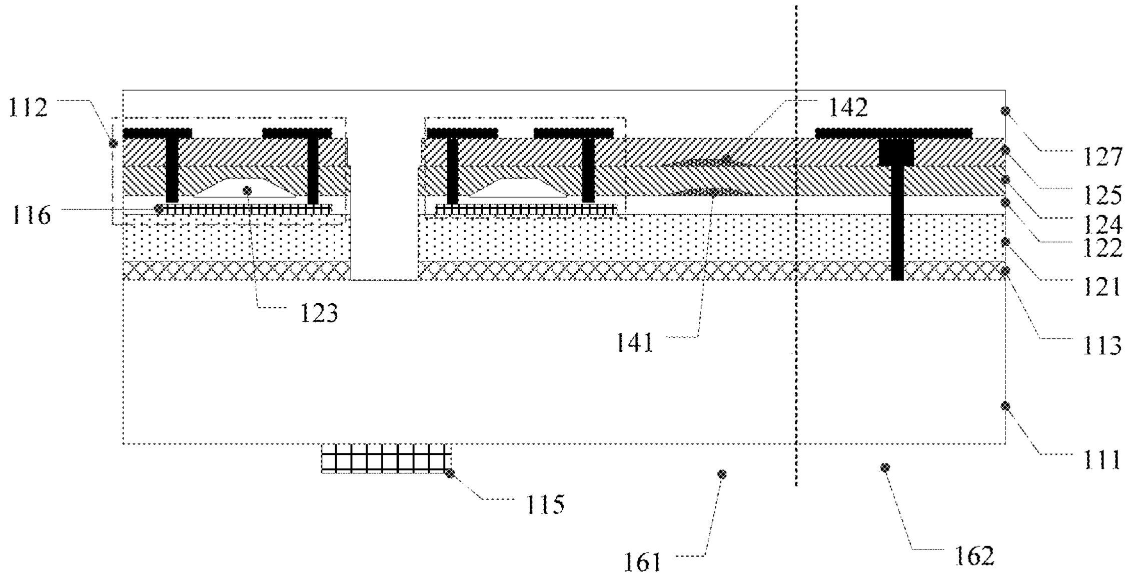
Figure 4O:
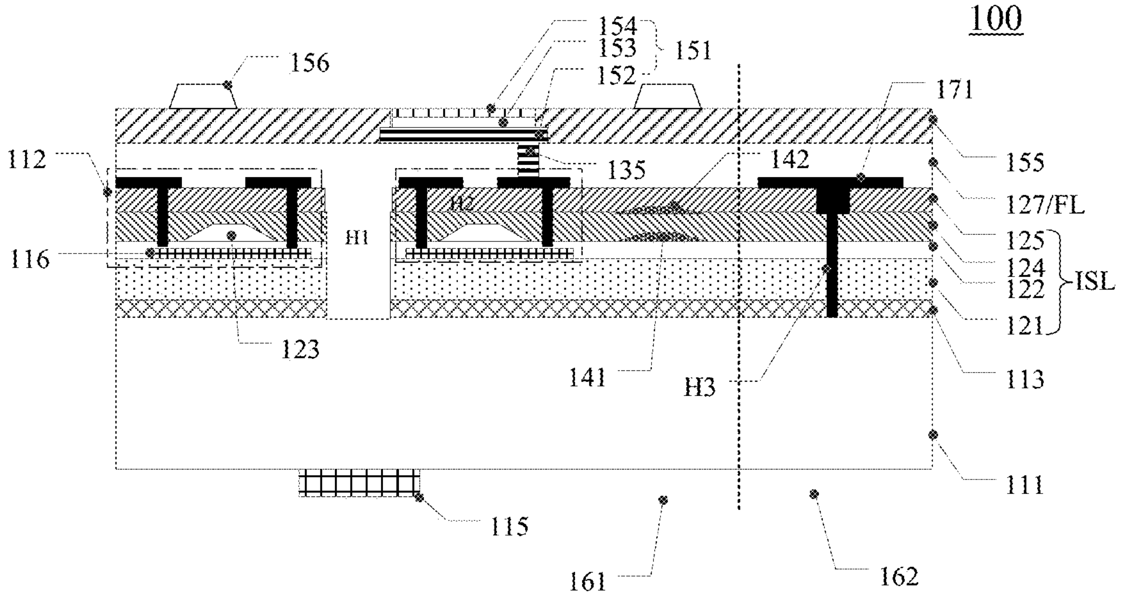

Step S214: forming a planarization layer 127 on the source electrode 129 and the drain electrode 126, whereby the sixth via hole 136, the first via hole 132, and the light transmission hole 114 of the light-shielding layer are filled with the material for forming the planarization layer 127 (see FIG. 4N).

For example, the planarization layer 127 may be made of a transparent insulating material. For example, the planarization layer 127 may be formed of an inorganic material or an organic material, and the planarization layer 127 may be formed of, for example, an organic resin, silicon oxide (SiOx), silicon oxynitride (SiNxOy), or silicon nitride (SiNx), but embodiments of the present disclosure are not limited thereto.

For example, by causing the material for forming the planarization layer 127 to fill the sixth via hole 136, the first via hole 132, and the light transmission hole 114 of the light-shielding layer, it is possible to avoid the decrease in light intensity through the light transmission hole 114 of the light-shielding layer caused by interfacial reflection between film layers (for example, interfacial reflection includes interfacial reflection between the buffer layer 121 and the gate insulating layer 122, interfacial reflection between the passivation layer 124 and the gate insulating layer 122, interfacial reflection between the interlayer insulating layer 125 and the passivation layer 124, and interfacial reflection between the planarization layer 127 and the interlayer insulating layer 125). Therefore, it is possible to further increase the intensity of diffuse reflection light from a finger incident on the imaging device 115 and improve the signal-to-noise ratio of the image output by the imaging device 115.

Step S215: forming a light emitting element 151 on the side of the planarization layer 127 away from the base substrate 111. For example, the light emitting element 151 is electrically connected to the source electrode or the drain electrode via the fifth via hole 135 in the planarization layer 127, whereby the light emitting element 151 can emit light under the drive of the thin film transistor 112. For example, the light emitting element 151 may be an organic light emitting diode, but embodiments of the present disclosure are not limited thereto. For the sake of clarity, the manufacturing method of the light emitting element 151 will be described later and will not be described in detail here.

Step S216: forming a plurality of spacers 156 at an interval are formed on a side of the light emitting element 151 away from the base substrate 111 (on a side surface of the pixel defining layer 155 of the light emitting element 151 away from the base substrate 111) (see FIG. 4O).

For example, the orthogonal projection of each spacer 156 on the array substrate 100 and the orthogonal projection of the first electrode 152 on the array substrate 100 are arranged at an interval, thereby preventing the force applied to the cover plate from being transmitted to the light emitting layer 153, and further ensuring the display quality of the display panel 10 including the array substrate 100. For example, the spacers 156 may be formed before forming the light emitting layer 153 and the second electrode 154 of the light emitting element 151, but embodiments of the present disclosure are not limited thereto; according to actual application requirements, the spacers 156 may also be formed after forming the light emitting layer 153 and the second electrode 154 of the light emitting element 151.

For example, in other examples, in the case where the array substrate 100 does not need to be provided with the connection electrode 171, the manufacturing method of the array substrate does not need to form the third via hole 133 and the fourth via hole 134 in steps S208 and S212, respectively, and does not need to form the connection electrode 171 in step S213.

For example, in other examples, when the array substrate 100 does not need to be provided with the first capacitor electrode 141 and the second capacitor electrode 142 to form capacitance, the manufacturing method of the array substrate does not need to perform steps S209, S210 and S211, does not need to form the first capacitor electrode 141 in step S206, and does not need to form the sixth via hole 136 and the fourth via hole 134 in step S212. In this case, the source electrode 129, the drain electrode 126 and the connection electrode 171 of the thin film transistor 112 may be disposed on a side surface of the passivation layer 124 away from the base substrate 111, the source electrode 129 and the drain electrode 126 contacting the active layer 116 through the second via holes 131 in the passivation layer 124 and the gate insulating layer 122, and the connection electrode 171 is in contact with the light shielding layer 113 through the third via hole 133 in the passivation layer 124, the gate insulating layer 122, and the buffer layer 121. In addition, the material of the planarization layer 127 fills the first via hole 132 and the light transmission hole 114 of the light shielding layer to reduce interfacial reflection and increase the light intensity incident on the imaging device 515.

For example, the first via hole 132 is not limited to be formed after forming the passivation layer 124 of the thin film transistor 112 and before forming the second capacitor electrode 142 (i.e., before forming the source electrode 129 and the drain electrode 126). The fabrication sequence of the film layers of the first via hole 132 and the thin film transistor 112 can be set according to actual application requirements, and the embodiments of the present disclosure is not specifically limited to this case.

For example, in other examples, the first via hole 132 may be formed in the gate insulating layer 122 after forming the gate insulating layer 122 and before forming the gate electrode 123, so as to expose the light shielding layer 113, and the light shielding layer 113 may be patterned through the first via hole 132 to form a light transmission hole, for example, while forming the gate electrode 123. For example, by patterning the light-shielding layer 113 to form a light transmission hole after forming the active layer 116 of the thin film transistor 112, the diameter of the light transmission hole 114 of the light-shielding layer can be increased, whereby the intensity of the diffuse reflection light that is from a finger and incident on the imaging device 115 can be increased and the signal-to-noise ratio of the image output by the imaging device 115 can be improved. In this case, as illustrated in FIG. 5B, the passivation layer 124 may be formed on the gate electrode 123 while the first via hole 132 and the light transmission hole 114 of the light-shielding layer are filled with the material for forming the passivation layer 124, and then the light transmission hole 114 is not exposed in the process of patterning the interlayer insulating layer 125 and the planarization layer 127. Thus, the light transmission hole 114 is finally filled with the passivation layer 124 (see FIG. 5B). in the region corresponding to the light transmission hole 114 of the light-shielding layer, there is no interface reflection between the buffer layer 121 and the gate insulating layer 122 and no interface reflection between the passivation layer 124 and the gate insulating layer 122, thereby still increasing the intensity of the diffuse reflection light that is from a finger and incident on the imaging device 115 to a certain extent and increasing the signal-to-noise ratio of the image output by the imaging device 115.

For example, in other examples, the second via holes 131, the first via hole 132, and the third via hole 133 may also be formed in the gate insulating layer 122, the passivation layer 124, and the interlayer insulating layer 125 after the interlayer insulating layer 125 is formed and before the source electrode 129 and the drain electrode 126 are formed. For example, in order to ensure that the etching depth of the first via hole 132 and the third via hole 133 are the same and both are greater than the etching depth of the second via holes 131, a halftone mask etching technique may be used. The specific etching methods can be referred to the conventional halftone mask etching technique, which will not be repeated here. For example, by forming the first via hole 132 after forming the interlayer insulating layer 125 and before forming the source electrode 129 and the drain electrode 126, the first via hole 132 and the third via hole 133 may be formed only in the patterning process of making the second via holes 131; at this time, not only can the diameter of the light transmission hole 114 of the light-shielding layer be increased, but also two patterning processes can be reduced; furthermore, the imaging quality can be improved, the manufacturing efficiency of the array substrate 100 and the display device can be further improved, and the manufacturing costs of the array substrate 100 and the display device can be further reduced. In this case, the planarization layer 127 may be formed on the source electrode 129 and the drain electrode 126 while filling the first via hole 132 and the light transmission hole 114 of the light-shielding layer with the material for forming the planarization layer 127 (see FIG. 5C), whereby interface reflection can be reduced, further the intensity of the diffuse reflection light that is from a finger and incident on the imaging device 115 can be increased, and the signal-to-noise ratio of the image output by the imaging device 115 can be increased.

For example, in other examples, after forming the patterned active layer 116 as illustrated in FIG. 4D, the buffer layer 121 may be patterned to form a first via hole 132 and a third via hole 133 that expose the light shielding layer 113, and then the light shielding layer 113 may be patterned through the first via hole 132 to form the light transmitting hole 114. The first via hole 132 in the buffer layer 121 is then filled by the gate insulating layer 122 (see FIG. 5D), which also causes the light transmission hole 114 of the light-shielding layer 113 to be filled by the gate insulating layer 122. Thereafter, the light transmission hole 114 is not exposed in the process of patterning the passivation layer 124, the interlayer insulating layer 125 or the planarization layer 127. Thus, the light transmission hole 114 is finally filled by the gate insulating layer 122 (see FIG. 5D). In the region corresponding to the light transmission hole 114 of the light-shielding layer, there is no interfacial reflection between the buffer layer 121 and the gate insulating layer 122, thus the intensity of the diffuse reflection light that is from a finger and incident on the imaging device 115 can still be increased to a certain extent, and the signal-to-noise ratio of the image output by the imaging device 115 can be increased. For example, while the light-shielding layer 113 is patterned through the first via hole 132 to form the light transmission hole 114, another hole may be formed by patterning the light-shielding layer 113 through the third via hole 133. In this case, the connection electrode 171 in FIG. 5D will be filled into the additional hole so as to be electrically connected with the light shielding layer 1130.

For example, the manufacturing method of the light emitting element 151 provided in an embodiment of the present disclosure will be exemplarily described below with reference to FIG. 4O. For example, as illustrated in FIG. 4O, forming the light emitting element 151 on the side of the planarization layer 127 away from the base substrate 111 includes the following steps S121- to S126.

Step S121: forming a fifth via hole 135 in the planarization layer 127 (see FIG. 4O).

For example, the specific method of forming the fifth via hole 135 in the planarization layer 127 may refer to steps S101- to S103, and will not be described here.

Step S122: forming a first electrode 152 of the light emitting element 151, whereby the first electrode 152 is in contact with the source electrode or the drain electrode 126 of the thin film transistor 112 via the fifth via hole 135 (see FIG. 4O).

For example, the first electrode 152 may be an anode, but embodiments of the present disclosure are not limited thereto. For example, the first electrode 152 may include a reflective electrode, whereby light emitted from the light emitting element 151 can be reflected to the display side, thereby improving the light emitting efficiency of the light emitting element 151 and reducing the influence on the imaging device 115. For example, the first electrode 152 may be made of a stack of indium tin oxide (ITO) and a metal layer, but embodiments of the present disclosure are not limited thereto.

Step S123: forming a pixel defining layer 155 on the first electrode 152 (see FIG. 4O).

For example, the pixel defining layer 155 may be made of a transparent insulating material, but embodiments of the present disclosure are not limited thereto.

Step S124: patterning the pixel defining layer 155 and forming an opening in the pixel defining layer 155 to expose the first electrode 152 (see FIG. 4O).

For example, the pixel defining layer 155 may be patterned by a patterning process to form an opening in the pixel defining layer 155, but embodiments of the present disclosure are not limited thereto.

Step S125: forming a light emitting layer 153 of the light emitting element 151 on the first electrode 152.

For example, the light emitting layer 153 may emit light, and the wavelength of the emitted light depends on the material from which the light emitting layer 153 is made. The light emitting layer 153 may emit red light, green light or blue light, for example, whereby in the case where the light emitting layer 153 includes a plurality of light emitting units, the display panel can display a color image.

For example, the manufacturing material of the light emitting layer 153 can be selected according to actual application requirements, and the embodiments of the present disclosure are not specifically limited to this. For example, the material for making the light emitting layer 153 includes an organic fluorescent light emitting material or an organic phosphorus light emitting material. For example, for organic fluorescent luminescent materials, a luminescent material containing at least one of DCM, DCJT, DCJ, DCJT, etc. can emit red light; a luminescent material containing at least one of C-545T (coumarin), C-545MT, quinacridone (QA), polyaromatic hydrocarbon (PAH) and the like can emit green light; a luminescent material containing at least one of TBP, DSA-Ph, BD1, BD2 and the like can emit blue light; for organic fluorescent luminescent materials containing both DCJTB and TBP, white light can be emitted. For organophosphorus luminescent materials, a luminescent material containing at least one of PtOEP, $Btp_2Ir(acac)$, $Ir(piq)_2(acac)$ and the like can emit red light; a luminescent material containing at least one of $Ir(ppy)_3$, $Ir(mppy)_3$, $(ppy)_2$ Ir(acac) and the like can emit green light; a luminescent material containing at least one of FIrpic, FIrtaz, FIrN4 and other materials can emit blue light.

Step S126: forming a second electrode 154 on the light emitting layer 153 (see FIG. 4O). For example, when the first electrode 152 and the second electrode 154 are respectively applied with voltages, the light emitting layer 153 may emit light.

For example, in a case where the first electrode 152 may be an anode, the second electrode 154 may be a cathode, but embodiments of the present disclosure are not limited thereto. For example, the second electrode 154 may be made of a transparent conductive material or a metal with a relatively thin thickness so that the second electrode 154 has a transparent or translucent property (for example, the second electrode 154 may be made of a transparent conductive oxide material and a transparent alloy material, respectively), but embodiments of the present disclosure are not limited thereto.

The embodiments of the disclosure provide an array substrate, a manufacturing method thereof, a display panel and a display device. The array substrate, the manufacturing method thereof, the display panel and the display device can improve the imaging quality.

As illustrated in FIG. 4O and FIG. 5C, the insulating layer ISL is a buffer layer 121, a passivation layer 124, a gate insulating layer 122, and an interlayer insulating layer 125, and the planarization layer 127 is a filling layer FL. The first through hole H1 penetrates through the buffer layer 121, the passivation layer 124, the gate insulating layer 122, and the interlayer insulating layer 125.

Figure 5A:
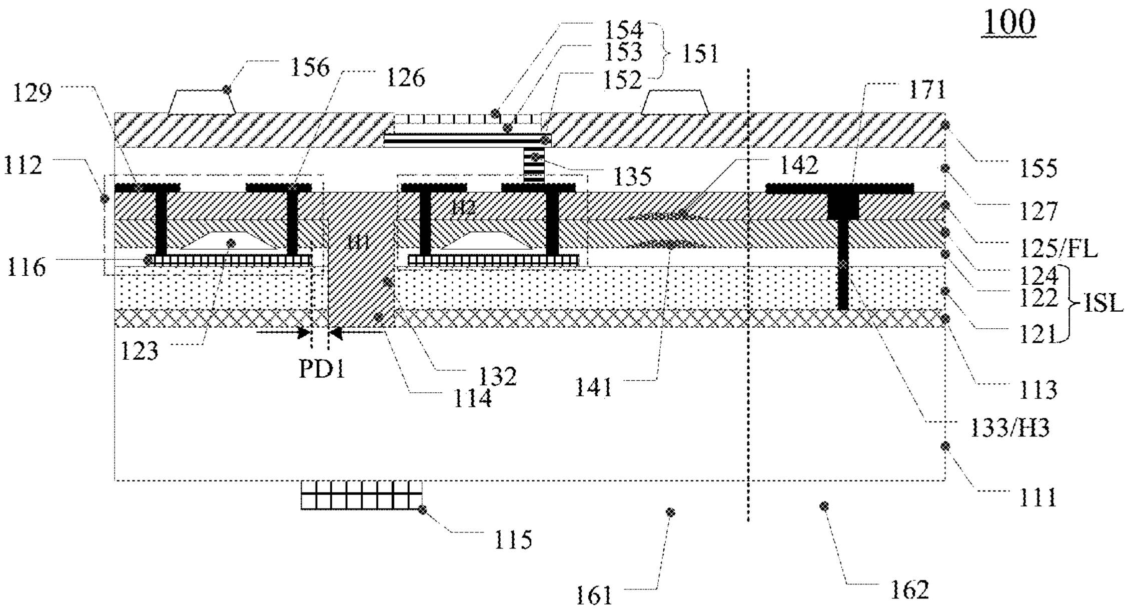
FIG. 5A is another exemplary structural diagram of an array substrate manufactured by the manufacturing method of the array substrate according to at least an embodiment of the present disclosure.
Figure 5B:
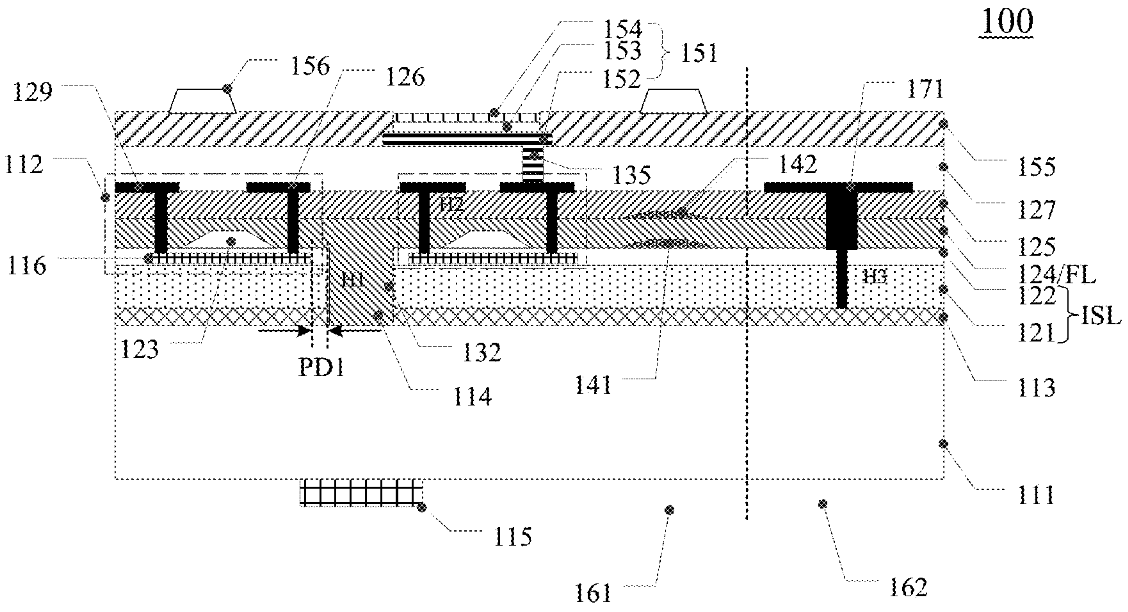
FIG. 5B is still another exemplary structural diagram of an array substrate manufactured by the manufacturing method of the array substrate according to at least an embodiment of the present disclosure.
Figure 5:
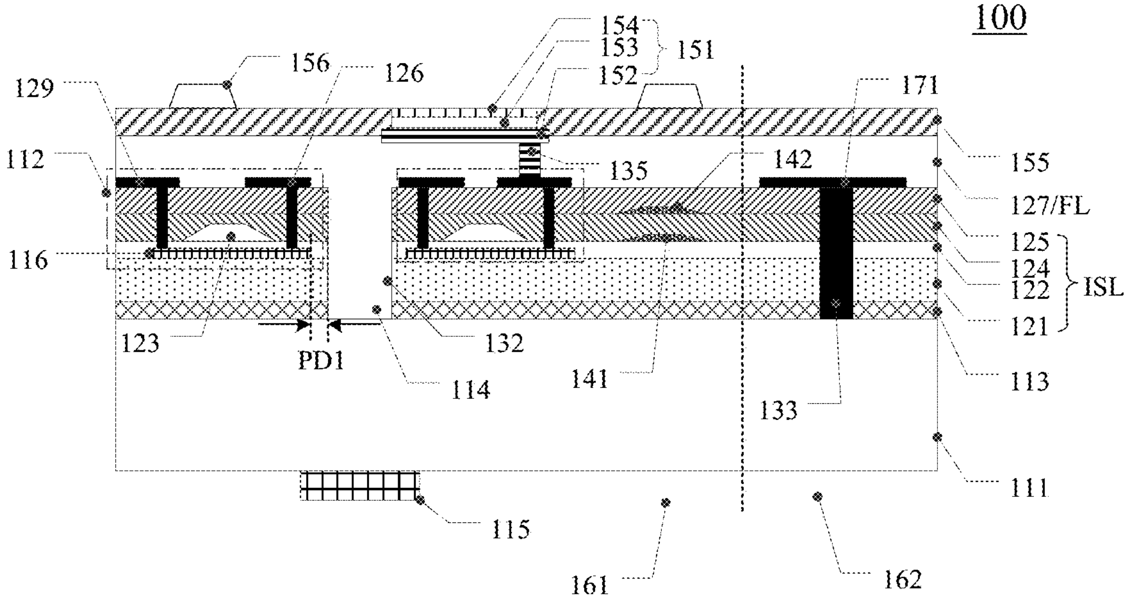
FIG. 5C is yet another exemplary structural diagram of an array substrate manufactured by the manufacturing method of the array substrate according to at least an embodiment of the present disclosure.
FIG. 5D is yet another exemplary structural diagram of the array substrate manufactured by the manufacturing method of the array substrate according to at least an embodiment of the present disclosure.

As illustrated in FIG. 5A, the insulating layer ISL is a buffer layer 121, a passivation layer 124, and a gate insulating layer 122, and the interlayer insulating layer 125 is a filling layer FL. The first through hole H1 penetrates through the buffer layer 121, the passivation layer 124, and the gate insulating layer 122.

As illustrated in FIG. 5B, the insulating layer ISL is a buffer layer 121 and a gate insulating layer 122, and the filling layer FL is a passivation layer 124. The first through hole H1 penetrates through the buffer layer 121 and the gate insulating layer 122.

Figure 5D:
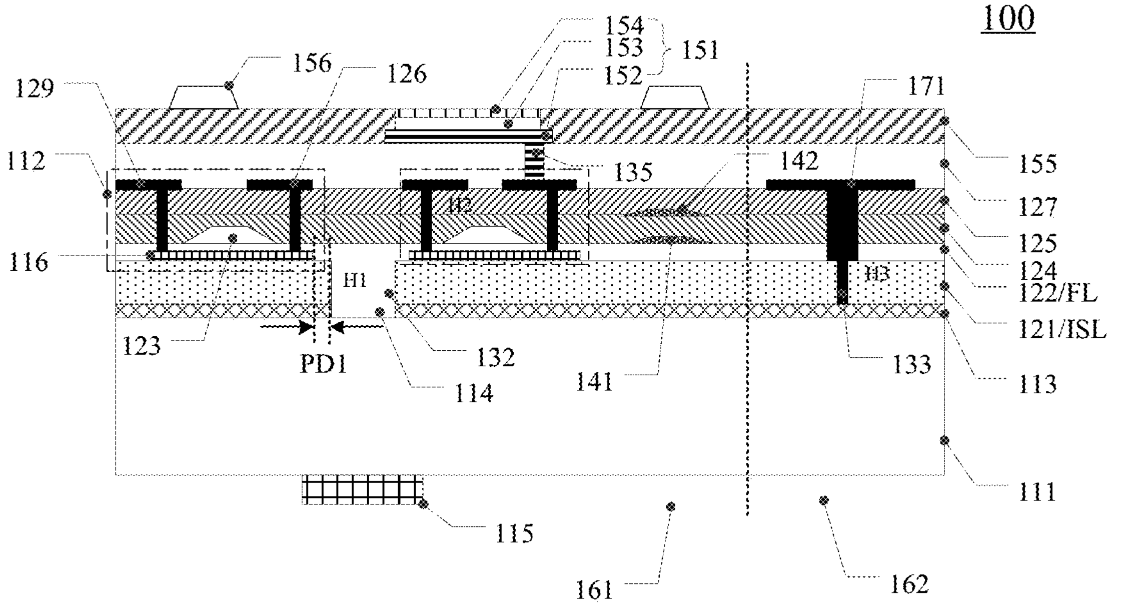

As illustrated in FIG. 5D, the insulating layer ISL is a buffer layer 121, and the filling layer FL is a gate insulating layer 122. The first through hole H1 penetrates the buffer layer 121.

In FIG. 4O and FIG. 5A to FIG. 5D, the second through hole H1 penetrates through the passivation layer 124, the gate insulating layer 122, and the interlayer insulating layer 125. The third through hole H3 penetrates the buffer layer 121, the passivation layer 124, the gate insulating layer 122, and the interlayer insulating layer 125.

The following points need to be explained:

(1) In the drawings of the embodiments of the present invention, only the structures related to the embodiments of the present invention are involved, and other structures may refer to common designs.

(2) For the sake of clarity, in the drawings used to describe embodiments of the present invention, the thickness and dimensions of the layers or structures are exaggerated. It will be understood that when an element such as a layer, film, region or substrate is referred to as being "on" or "under" another element, the element may be "directly" on "or" under "the other element, or intervening elements may be present.

(3) Without conflict, the features in the same embodiment and different embodiments of the present invention can be combined with each other.

Although the present disclosure has been described in detail with general descriptions and specific embodiments above, it will be obvious to those skilled in the art that some modifications or improvements can be made based on the embodiments of the present disclosure. Therefore, all such modifications or improvements made without departing from the spirit of this disclosure are within the scope of protection claimed in this disclosure.

The above description is merely an exemplary embodiment of the present disclosure and is not intended to limit the scope of protection of the present disclosure, which is determined by the appended claims.

What is claimed is:

1. An array substrate comprising:

a base substrate;

a light shielding layer, which is on the base substrate and comprises a light transmission hole;

an active layer of a thin film transistor, at one side of the light shielding layer away from the base substrate; and an insulating layer on the base substrate, the insulating layer including a first through hole, the first through hole being in fluid communication with the light transmission hole;

the array substrate further comprises an imaging device on a side of the base substrate away from the light shielding layer, wherein the imaging device at least partially overlaps the light transmission hole in a direction perpendicular to the base substrate.

2. The array substrate according to claim 1, wherein an orthogonal projection of the first through hole on the base substrate and an orthogonal projection of the active layer on the base substrate do not overlap.

3. The array substrate according to claim 1, wherein the orthogonal projection of the light transmission hole on the base substrate is completely within an orthogonal projection of the first through hole on the base substrate.

4. The array substrate according to claim 1, further comprising a filling structure, wherein the filling structure is filled in the first through hole and the light transmission hole.

5. The array substrate according to claim 4, wherein the first through hole and the light transmission hole are completely filled by the filling structure.

6. The array substrate according to claim 4, further comprising a filling layer, wherein the filling layer is located on a side of the insulating layer away from the base substrate, and the filling structure is integrally formed with the filling layer.

7. The array substrate according to claim 6, wherein the filling layer comprises any one of a group consisting of a passivation layer, a gate insulating layer, an interlayer insulating layer, and a planarization layer.

8. The array substrate according to claim 1, wherein the insulating layer comprises at least one of a group consisting of a buffer layer, a passivation layer, a gate insulating layer, and an interlayer insulating layer.

9. The array substrate according to claim 8, further comprising a source electrode and a drain electrode, wherein the source electrode and the drain electrode are respectively connected to the active layer through second through holes penetrating at least one of the passivation layer, the gate insulating layer and the interlayer insulating layer.

10. A display panel comprising the array substrate according to claim 1.

11. A display device comprising the display panel according to claim 10.

12. An array substrate comprising:

a base substrate;

a light shielding layer, which is on the base substrate and comprises a light transmission hole;

an active layer of a thin film transistor, at one side of the light shielding layer away from the base substrate; and an insulating layer on the base substrate, the insulating layer including a first through hole, the first through hole being in fluid communication with the light transmission hole;

wherein the insulating layer comprises at least one of a group consisting of a buffer layer, a passivation layer, a gate insulating layer, and an interlayer insulating layer;

the array substrate further comprises a connection electrode, wherein the connection electrode is connected to the light shielding layer through a third through hole penetrating at least one of the buffer layer, the passivation layer, the gate insulating layer, and the interlayer insulating layer.

13. A manufacturing method of an array substrate, comprising:

providing a base substrate;

forming a light shielding film layer on the base substrate;

forming an active layer of a thin film transistor on the light shielding thin film layer; and after the active layer is formed, patterning the light shielding film layer to form a light shielding layer, wherein the light shielding layer comprises a light transmission hole.

14. The manufacturing method of the array substrate according to claim 13, further comprising: forming an insulating layer, patterning the insulating layer to form a first through hole therein, patterning the light shielding thin film layer through the first through hole to form the light transmission hole, wherein an orthogonal projection of the first through hole on the base substrate and an orthogonal projection of the active layer on the base substrate do not overlap.

15. The manufacturing method of the array substrate according to claim 14, further comprising: forming a filling structure, wherein the filling structure is filled in the first through hole and the light transmission hole.

16. The manufacturing method of the array substrate according to claim 15, further comprising forming a filling layer on the insulating layer, wherein the filling structure is part of the filling layer.

17. The manufacturing method of the array substrate according to claim 16, wherein the filling layer comprises any one of a group consisting of a passivation layer, a gate insulating layer, an interlayer insulating layer, and a planarization layer.

18. The manufacturing method of the array substrate according to claim 14, wherein forming the insulating layer comprises forming at least one of a group consisting of a buffer film layer, a passivation film layer, a gate insulating film layer, and an interlayer insulating film layer.

19. The manufacturing method of the array substrate according to claim 18, further comprising: forming a connection electrode and forming a third through hole penetrating at least one of the buffer film layer, the passivation film layer, the gate insulating film layer, and the interlayer insulating film layer, wherein the connection electrode is connected to the light shielding layer through the third through hole.

20. The manufacturing method of the array substrate according to claim 14, wherein forming the insulating layer comprises forming a passivation layer, a gate insulating layer, and an interlayer insulating layer, the manufacturing method further comprises:

forming a gate electrode, a source electrode, a drain electrode, a first capacitor electrode, and a second capacitor electrode, the interlayer insulating layer is located between the passivation layer and a layer in which the source electrode and the drain electrode are located, the first capacitor electrode and the second capacitor electrode at least partially overlap in the direction perpendicular to the base substrate to form a capacitor, the first capacitor electrode is disposed between the gate insulating layer and the passivation layer, the first capacitor electrode is formed in a first patterning process during forming a gate electrode; and the second capacitor electrode is disposed between the passivation layer and the interlayer insulating layer, the second capacitor electrode is formed in a second patterning process during forming the light transmission hole of the light shielding layer.

* * * * *